United States Patent
Yang

(10) Patent No.: US 7,781,847 B2
(45) Date of Patent: Aug. 24, 2010

(54) DEVICE PATTERNED WITH SUB-LITHOGRAPHIC FEATURES WITH VARIABLE WIDTHS

(75) Inventor: Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 252 days.

(21) Appl. No.: 12/034,972

(22) Filed: Feb. 21, 2008

(65) Prior Publication Data

US 2008/0135948 A1 Jun. 12, 2008

Related U.S. Application Data

(62) Division of application No. 11/379,634, filed on Apr. 21, 2006, now Pat. No. 7,407,890.

(51) Int. Cl.
H01L 27/088 (2006.01)
(52) U.S. Cl. ............................... 257/392; 257/E27.098
(58) Field of Classification Search ................ 257/392, 257/E27.098
See application file for complete search history.

(56) References Cited

U.S. PATENT DOCUMENTS

| 5,023,203 | A | 6/1991 | Choi |
| 6,514,819 | B1 | 2/2003 | Choi |
| 6,709,982 | B1 | 3/2004 | Buynoski |
| 7,101,759 | B2 | 9/2006 | Han |
| 7,547,947 | B2 * | 6/2009 | Anderson et al. ........... 257/369 |
| 2003/0229868 | A1 | 12/2003 | White et al. |
| 2006/0126153 | A1 | 6/2006 | Pan |
| 2007/0065990 | A1 | 3/2007 | Degroote et al. |

FOREIGN PATENT DOCUMENTS

KR  2004000700 A  1/2004

OTHER PUBLICATIONS

Yang-Kyu Choi, Tsu-Jae King, and Chenming Hu entitled "A Spacer Patterning Technology for Nanoscale CMOS" IEEE Transactions on Electron Devices, vol. 49, No. 3, Mar. 2002, pp. 436-441.

* cited by examiner

Primary Examiner—Trung Dang
(74) Attorney, Agent, or Firm—H. Daniel Schnurmann; Graham S. Jones

(57) ABSTRACT

A method of processing a substrate of a device comprises the as following steps. Form a cap layer over the substrate. Form a dummy layer over the cap layer, the cap layer having a top surface. Etch the dummy layer forming patterned dummy elements of variable widths and exposing sidewalls of the dummy elements and portions of the top surface of the cap layer aside from the dummy elements. Deposit a spacer layer over the device covering the patterned dummy elements and exposed surfaces of the cap layer. Etch back the spacer layer forming sidewall spacers aside from the sidewalls of the patterned dummy elements spaced above a minimum spacing and forming super-wide spacers between sidewalls of the patterned dummy elements spaced less than the minimum spacing. Strip the patterned dummy elements. Expose portions of the substrate aside from the sidewall spacers. Pattern exposed portions of the substrate by etching into the substrate.

10 Claims, 21 Drawing Sheets

EXTRA-WIDE HARD MASK SPACERS FORMED
BETWEEN CLOSELY SPACED POLYSILICON
DUMMY FEATURES

FIG. 6 STEP F

DEVICE PATTERNED WITH SUB-LITHOGRAPHIC FEATURES WITH VARIABLE WIDTHS

The application is a division of U.S. patent application Ser. No. 11/379,634 filed 21 Apr. 2006.

BACKGROUND OF THE INVENTION

This invention relates to methods of manufacture of semiconductor devices, and more particularly to methods of manufacture of features of semiconductor devices by a sequence of steps including hard mask forming techniques.

Contemporary integrated circuit products require a large number of on-chip memory devices. On a typical microprocessor chip, more than two-thirds (⅔) of the surface area of the chip is occupied by Static Random Access Memory (SRAM) devices.

As integrated circuit dimensions inexorably become smaller and smaller thereby reducing the size of FET devices, we have found that it becomes more and more difficult to continue the trend of scaling SRAM devices to smaller sizes, mainly due to limitations of photolithographic resolution.

Using spacers to pattern sublithographic single features having constant widths has been proposed for FinFET patterning. A prior art approach to forming RSD regions in FinFET devices which illustrates the problems described above is shown in a paper by Yang-Kyu Choi, Tsu-Jae King, and Chenming Hu entitled "A Spacer Patterning Technology for Nanoscale CMOS" IEEE Transactions on Electron Devices, Vol. 49, No. 3, March 2002, PP. 436-441 describes a spacer patterning technology using a sacrificial layer and CVD spacer layer wherein the minimum sized features are finished not by photolithography but the CVD film thickness A set of FinFET devices is formed a Silicon-On-Insulator (SOI) substrate formed of a Buried Oxide (BOX) substrate covered with a thin insulator layer covered in turn by a polysilicon layer covered in turn by a silicon oxide hard mask layer. Two parallel, rectangular sacrificial SiGe features with vertical sidewalls are formed on the surface of the hard mask layer. Next, the sidewalls of the SiGe features are lined with Phospho-Silicate Glass (PSG) sidewall spacers, which also have vertical sidewalls. Then the sacrificial SiGe features are removed by selective dry etching leaving PSG spacer structures. Residues of SiGe were then removed by a selective wet etch. Then two source drains masks were then formed across the distal ends of the PSG spacer structures. Next, source/drain regions and fins of a FinFET device are formed by dry etching away the hard mask in a $CF_4$ atmosphere and the polysilicon unprotected by the masks and the PSG features by etching in $Cl_2$ and HBr gas atmosphere. However, the FinFET application described by Choi et al. is very limited because the width of the patterned feature can not be adjusted.

In an SRAM device, it is required that the pull down NFET must be stronger than the pass-gate NFET in order for SRAM to be stable, i.e., not to be disturbed during the read process. This requires width of the pull down NFET must be greater than the width of the pass gate.

U.S. Pat. No. 6,709,982 of Buynoski et al. entitled "Double spacer FinFET Formation" describes a method for forming a group of structures in a semiconductor device. Start by forming a conductive layer on a substrate, where the conductive layer includes a conductive material. Then form an oxide layer over the conductive layer. Then etch at least one opening in the oxide layer, fill at least one opening with the conductive material, etch the conductive material to form spacers along sidewalls of that one opening, and remove the oxide layer and a portion of the conductive layer to form the group of structures.

U.S. Pat. No. 5,023,203 of Choi entitled "Method of Patterning Fine Line Width Semiconductor Topology Using a Spacer" describes a method for reducing the line widths produced by patterning a semiconductor substrate with a multilayer resist mask employing a spacer-forming oxide layer over the mask after an aperture for exposing a lower resist layer has been formed in an upper portion of the multilayer mask, but prior to etching a lower resist layer. The oxide layer is subjected to a dry systemic etch to vertically remove material of the oxide layer down to the surface of the lower resist layer. Because of the substantial step coverage of the oxide layer, a spacer or stringer portion remains along the sidewalls of the original aperture in the upper portion of the mask, whereby the dimensions of the exposure window are reduced. Retaining this sidewall spacer as an integral part of mask structure permits narrower line widths to be replicated in the underlying substrate.

SUMMARY OF THE INVENTION

An object of this invention is to provide a method of patterning sub-lithographic features with variable widths.

Another object of this invention is to provide method for manufacturing very high density SRAM devices by a method of patterning sub-lithographic features with variable widths.

In accordance with this invention, a method is provided for patterning sublithographic features with variable widths. A device is formed on a substrate (e.g. a semiconductor wafer.) First a cap layer is formed over the substrate. Then dummy features composed of hard mask material are formed over the substrate employing regular photoresist patterns resolvable employing conventional lithography techniques, but the dummy features are spaced by variable widths. A layer of hard mask material is then formed over the device covering the dummy features and then the hard mask material is etched back leaving narrow sidewall spacer features composed of the hard mask material on the sidewalls of the more widely spaced dummy features and leaving super-wide spacer features, also composed of the hard mask material, between each pair of closely placed dummy features. That is to say that the space between each pair of closely placed dummy features is filled with spacer material in the form of a super-wide spacer feature. The dummy features are then removed from wafer leaving the hard mask features including the narrow width sidewall spacer features and the super-wide spacer features above the cap layer. The sidewall spacer features and the super-width spacer features are then used as a hard mask to achieve matching final patterns in the cap layer which are transferred into the substrate by etching into the substrate to form separate narrow and wide substrate features in the pattern of the hard mask. A very high density SRAM can be manufactured using this method.

Further in accordance with this invention, a method of processing a substrate of a device comprises the as following steps. Form a cap layer over the substrate. Form a dummy layer over the cap layer, the cap layer having a top surface. Etch the dummy layer forming patterned dummy elements of variable widths and exposing sidewalls of the dummy elements and portions of the top surface of the cap layer aside from the dummy elements. Deposit a spacer layer over the device covering the patterned dummy elements and exposed surfaces of the cap layer. Etch back the spacer layer forming sidewall spacers aside from the sidewalls of the patterned dummy elements spaced above a minimum spacing and forming super-wide spacers between sidewalls of the patterned dummy elements spaced less than the minimum spacing. Strip the patterned dummy elements. Expose portions of the substrate aside from the sidewall spacers. Pattern exposed portions of the substrate by etching into the substrate.

In accordance with another aspect of this invention, an SRAM device with pull up, pull down and pass transistors includes channels of the transistors which are sublithographic with channels of said pull down transistors being wider than channels of said pass transistors.

The invention and objects and features thereof will be more readily apparent from the following detailed description and appended claims when taken with the drawings.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENTS

Preferred Embodiment

FIGS. 1A-1L are elevational, sections of a semiconductor device 10 in the process of manufacture in accordance with the method of this invention.

Figure 2:
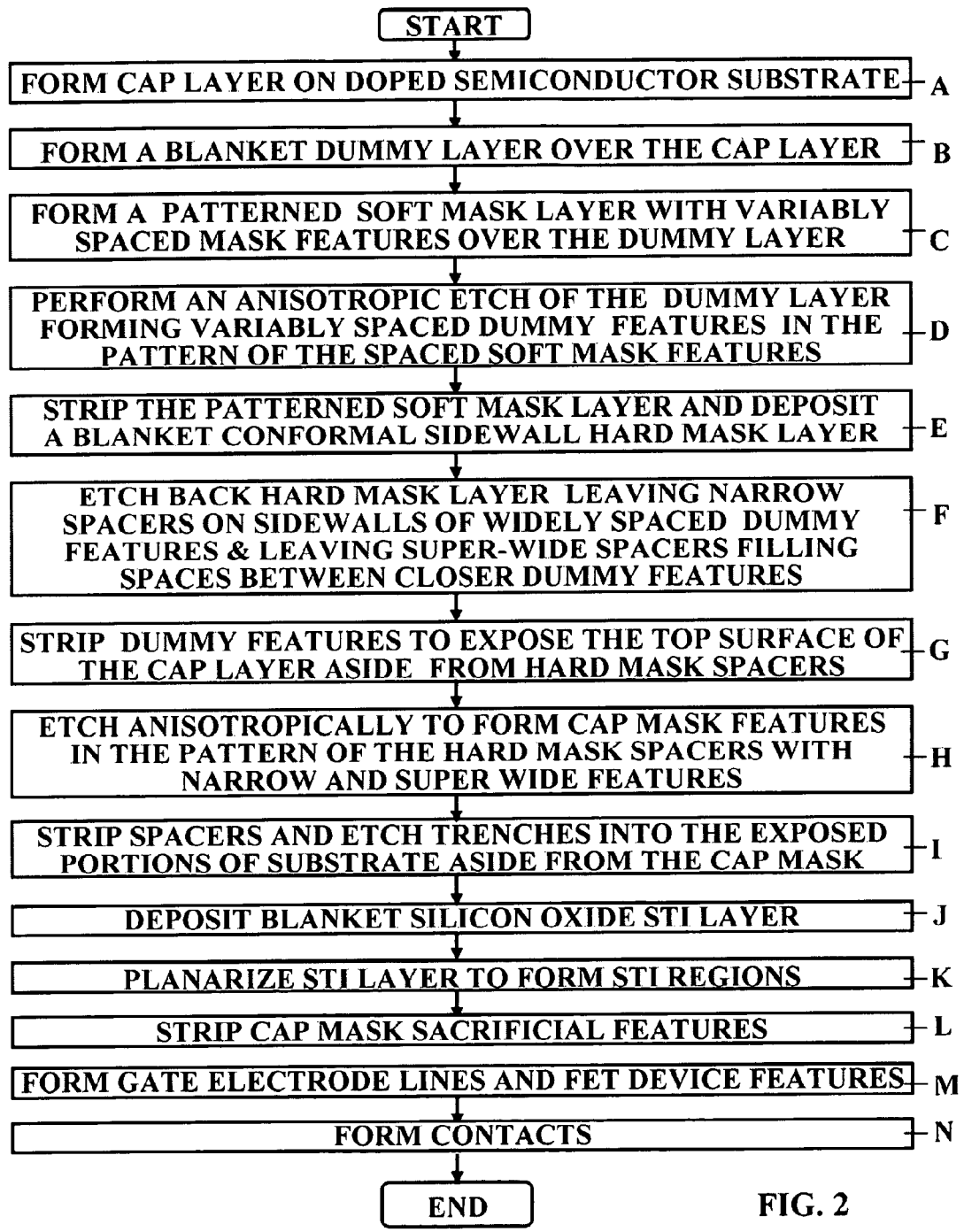
FIG. 2 is a flowchart which illustrates a process of manufacture in accordance with the method of this invention.

FIG. 2 is a flowchart which illustrates a process of manufacture of a semiconductor device 10 in accordance with the method of this invention.

Step A

Figure 1A:
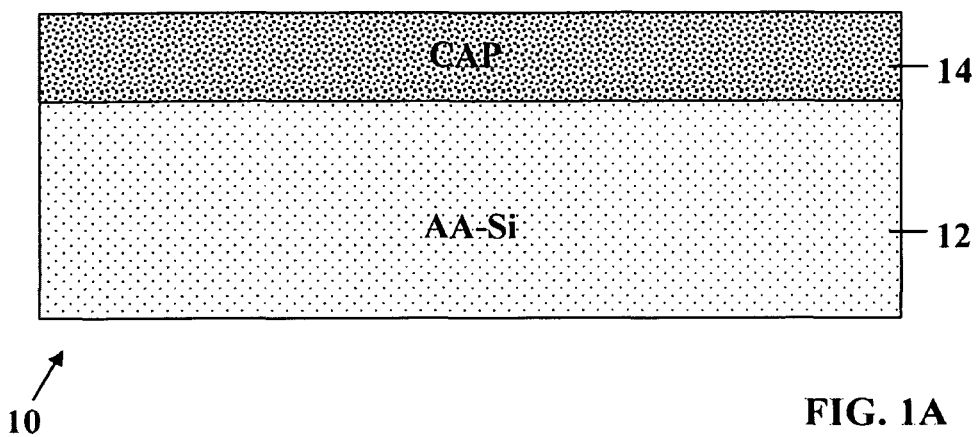
FIGS. 1A-1L are elevational sections of a semiconductor device 10 in the process of manufacture in accordance with the method of this invention, a flow chart of which is shown in FIG. 2.

FIG. 1A shows a vertical elevation of a semiconductor device 10 in the first step A of the process of manufacture thereof in accordance with this invention as illustrated by the flowchart shown in FIG. 2. A silicon substrate 12, previously doped with N or P-type dopant to provide an active region, the top surface of which has been coated with a blanket cap layer 14 composed of a sacrificial material, e.g., silicon nitride ($Si_3N_4$), which is to be patterned and then removed later.

Step B

Figure 1B:
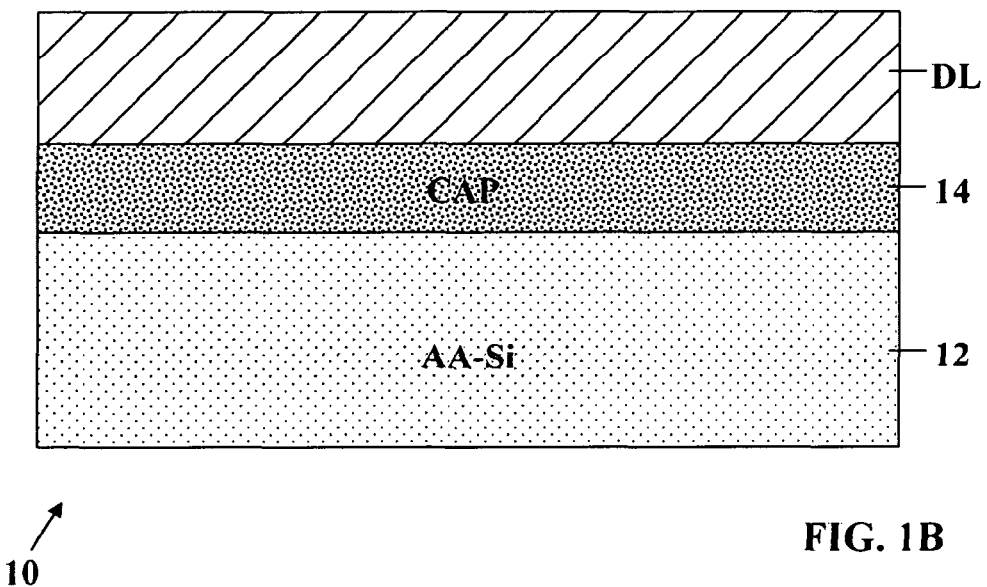

FIG. 1B shows the device 10 of FIG. 1A after a blanket dummy layer D preferably comprising polysilicon has been deposited upon the top surface of the cap layer 14 in accordance with step B of the invention as illustrated by the flowchart shown in FIG. 2.

Step C

Figure 1C:
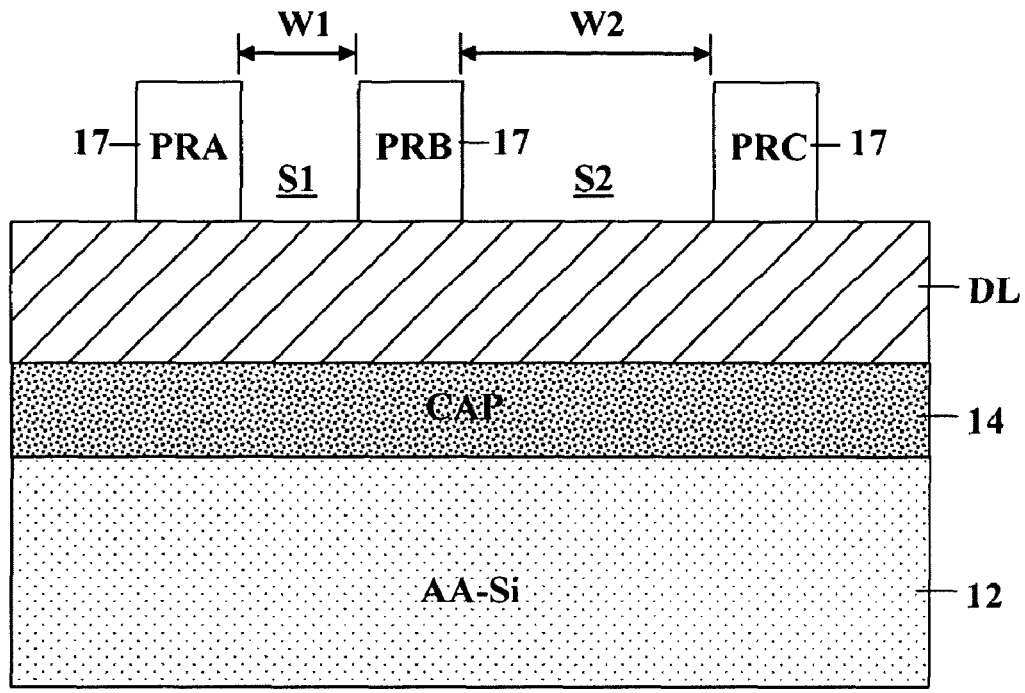

FIG. 1C shows the device 10 of FIG. 1B after a patterned mask 17 with three pattern features PRA, PRB, and PRC has been formed over the blanket dummy layer D. In practice, the patterned mask 17 would include many more features than the three pattern features PRA, PRB, and PRC. The three pattern features PRA, PRB, and PRC, which are illustrative, have equal widths across the surface of the dummy D. There are two spaces, i.e., narrow space S1 and wider space S2, which have narrow and wide widths W1 and W2 respectively. The space S1 has the relatively narrow width W1 between the features PRA and PRB and space S2 has the relatively wide width W2 between the features PRB and PRC across the surface of the hard mask D. Space S2 is wider than space S1, i.e., W2>>W1. Preferably, the patterned mask 17 comprises a photolithographic mask, formed over the blanket dummy layer D. For example, the mask 17 may be composed of a photoresist material.

Figure 3:
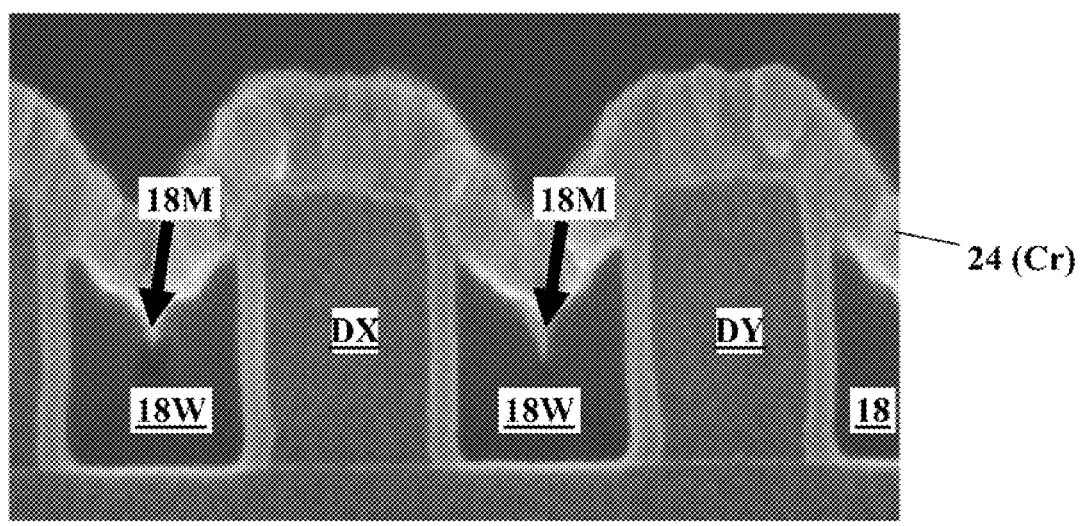
FIG. 3 is a photomicrograph showing the contour of an elevational section of a blanket layer of spacer material formed in spaces between hard mask patterning features marked by a layer of chromium.

FIG. 3 shows a plan view of another device 30 which has been processed in accordance with this invention through step C in FIG. 2 with the surface of the dummy layer D exposed except where it is covered by photoresist patterns 17 including photoresist patterns PR1, PR2, PR3 and PR4. The photoresist pattern PR1 is separated from pattern PR2 by the relatively narrow width W1. The photoresist pattern PR2 is obliquely separated from photoresist pattern PR3 by the width W2. The photoresist pattern PR3 is separated from photoresist pattern PR4 by the relatively narrow width W1.

Step D

Figure 1D:
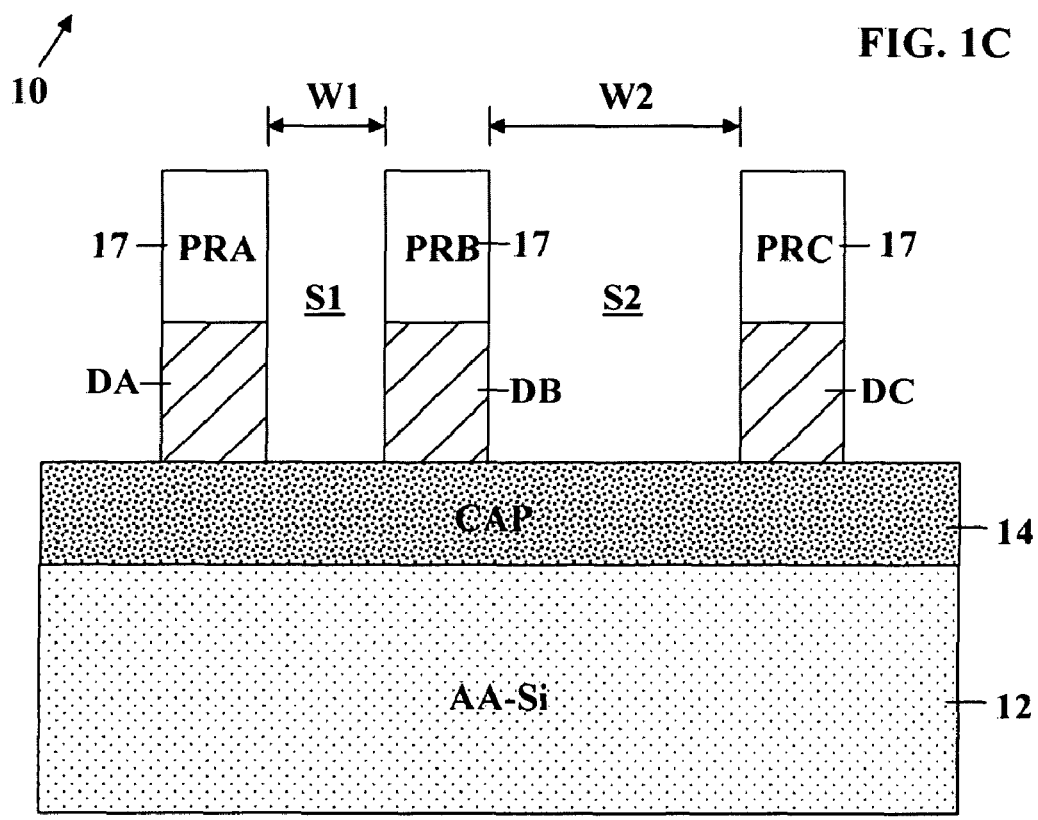

FIG. 1D shows the device 10 of FIG. 1C after an anisotropic etching process has been performed to etch the dummy layer D with substantially vertical sidewalls exposing portions of the top surface of the cap layer 14 in accordance with step D of the invention as illustrated by the flowchart shown in FIG. 2. The dummy layer D has been patterned into with three dummy features DA, DB, and DC in alignment with pattern features 17A, 17B, and 17C. The three dummy features DA, DB, and DC are spaced by spaces S1 and S2 with the widths W1 and W2 respectively. Again as with FIG. 1C, space S1 has the width W1 between the dummy features DA and DB and space S2 has the width W2 between the dummy features DB and DC across the surface of the cap layer 14. The dummy layer is etched anisotropically, preferably by Reactive Ion Etching (RIE) in a chlorine containing ambient such as $CCl_2F_2$ or $Cl_2$ chamber in a plasma environment.

Figure 4:
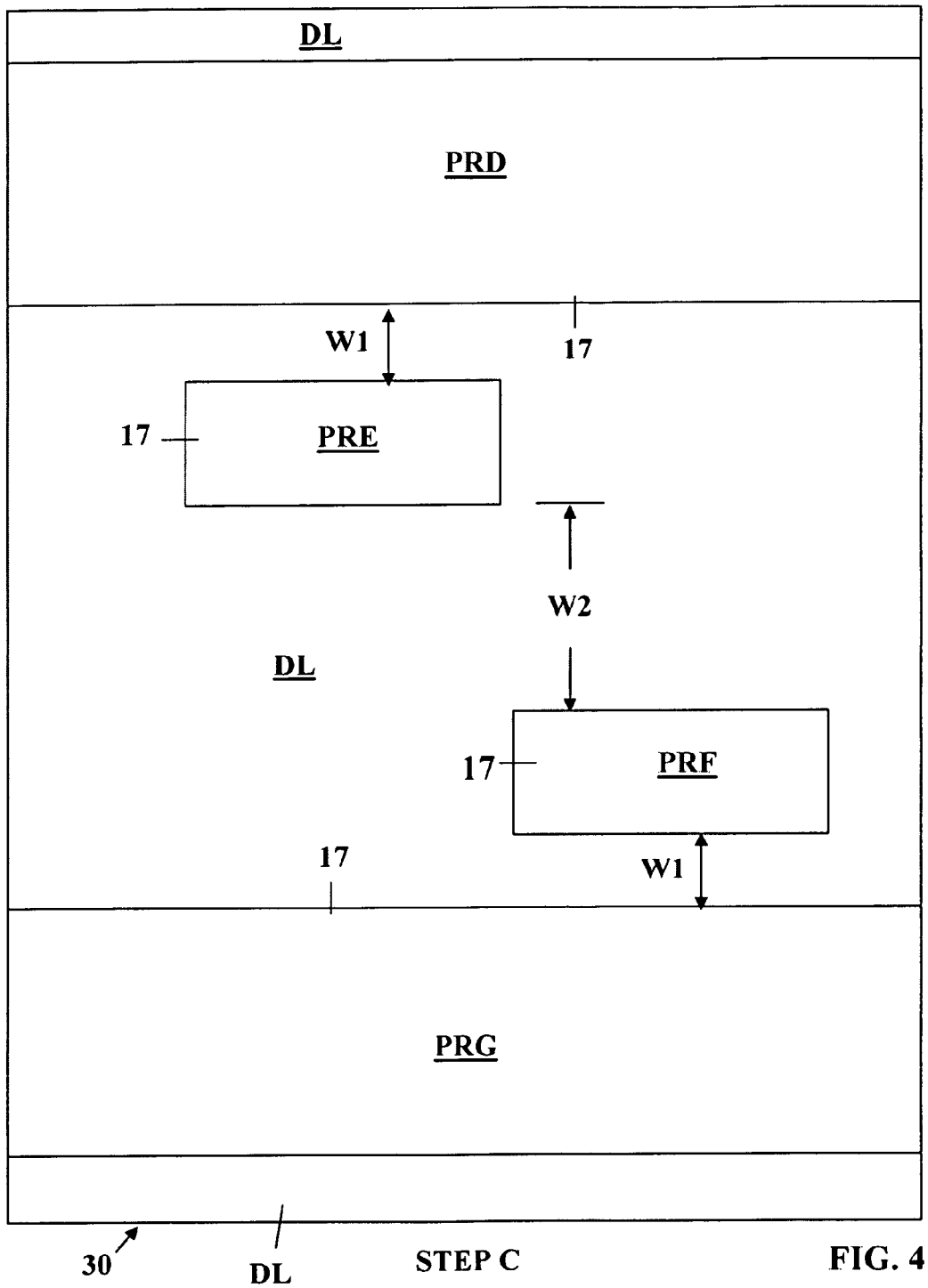
FIGS. 4-13 show plan views of a device during the processing steps of FIG. 2.
Figure 5:
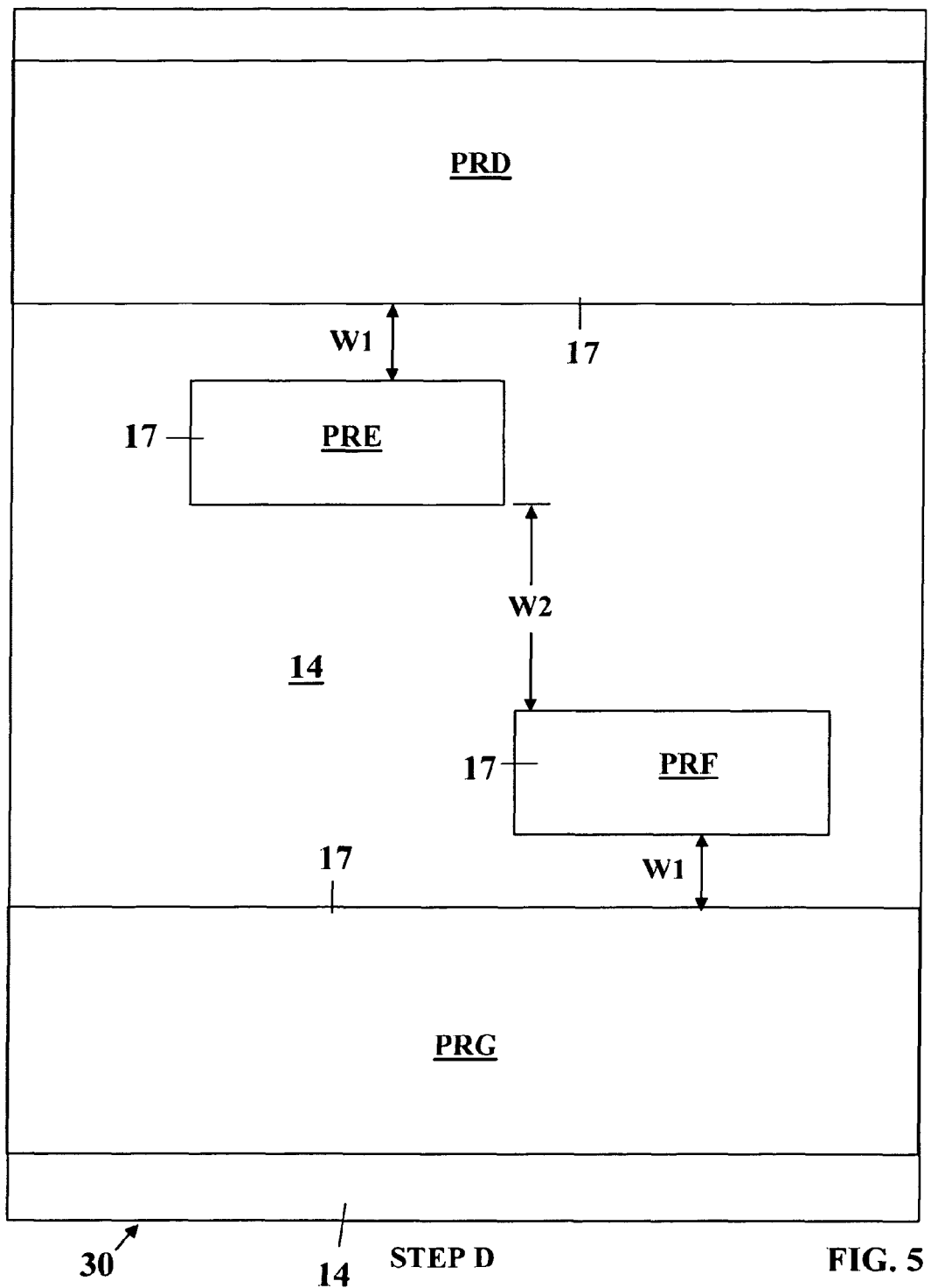

FIG. 5 shows a plan view of the device 30 of FIG. 4 which has been processed through etching the dummy layer D in accordance with step D in FIG. 2 with the surface of the cap layer 14 exposed except where it is covered by photoresist patterns 17 including photoresist patterns PR1, PR2, PR3 and PR4. As shown by FIG. 5 (as stated above with respect to FIG. 4) the photoresist pattern PR1 is separated from photoresist pattern PR2 by the relatively narrow width W1; photoresist pattern PR2 is obliquely separated from pattern PR3 by width W2; and photoresist pattern PR3 is separated from pattern PR4 by the relatively narrow width W1.

Step E

Figure 1E:
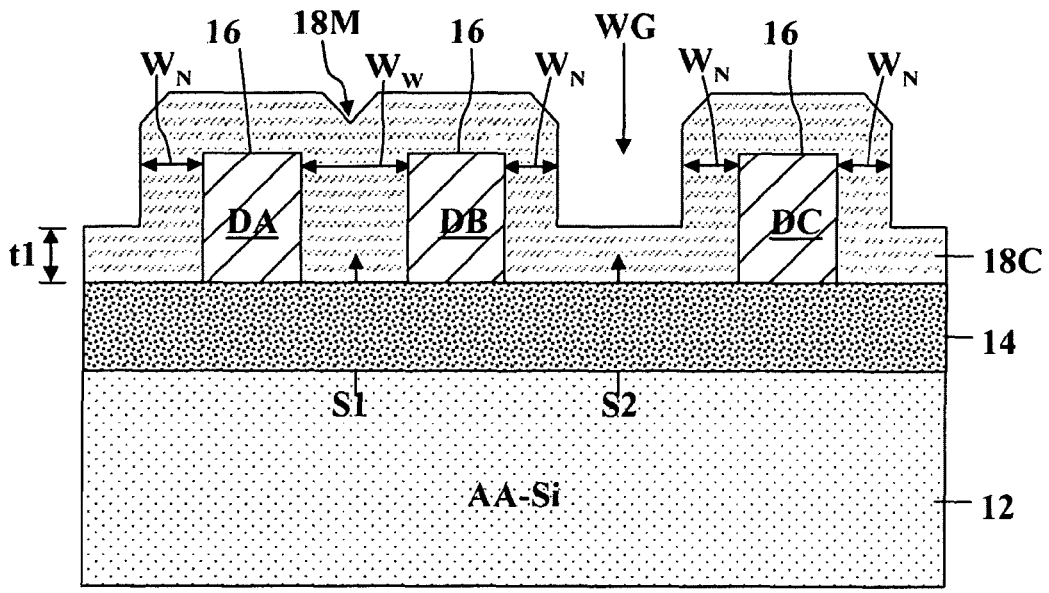

FIG. 1E shows the device 10 of FIG. 1D after deposition in accordance with step E of the invention as illustrated by the flowchart shown in FIG. 2 of a conformal, blanket, hard mask, spacer layer 18C composed of a spacer material adapted for use as a hard mask such as silicon oxide ($SiO_2$) which covers the entire device 10. The thickness "t1" of the conformal, hard mask, spacer layer 18C is sufficient to fill the relatively narrow space S1 but is too thin to fill the wider space S2 leaving a wide gap WG between the dummy features DB and DC. Assuming for the sake of explanation that the thickness "t1"

is equal to the width WN of the layer 18C on the sidewall of the dummy layer patterning feature DA aside from dummy layer patterning feature DB and the sidewalls of dummy layer patterning feature DC, it is useful to start with the concept that the wider width W2 is greater than thickness "t1" which is greater than the relatively narrow width W1, i.e., W2>t1>W1 and that width $W_n$<<2*t1 leaving the space WG between the sidewalls of dummy features DB and DC covered with layer 18C. The hard mask layer is preferably composed of silicon dioxide deposited by a CVD or PECVD process.

Example

If the value of W1 is 80 nm and the value of W2 is 150 nm, then t1 will have a thickness of from about 40 nm to about 60 nm.

Step F

Figure 1F:
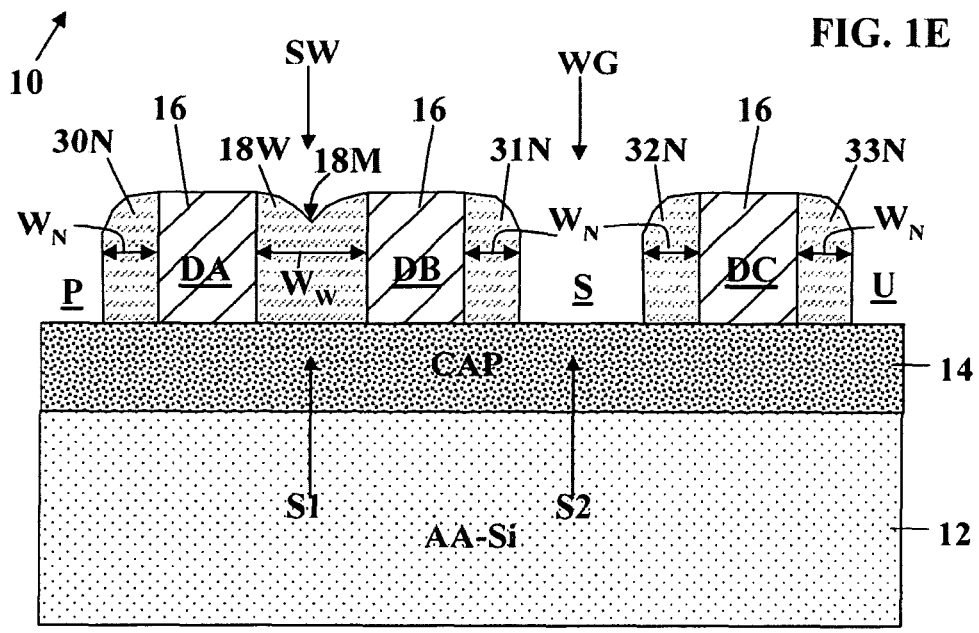

FIG. 1F shows the device 10 of FIG. 1E after formation of a patterned hard mask by partially etching back the conformal, blanket, hard mask, spacer layer 18C in a conventional spacer etch back processing step in accordance with step F of the invention as illustrated by the flowchart shown in FIG. 2. For a hard mask spacer layer 18C, the etching back is performed by Reactive Ion Etching (RIE) in a chamber using an ambient environment containing fluorine, e.g., $CF_4$ in a plasma environment.

The etching back leaves narrow, hard mask, sidewall spacers 30N, 31N, 32N and 33N on the sidewalls of the dummy features DA, DB, and DC except that in the relatively narrow space S1 a super-wide, hard mask spacer 18W is formed filling most or all of the space S1 between the sidewalls of the adjacent dummy features DA and DB. The super-wide, hard mask spacer 18W is shown in the super-wide spacer region SW with a crease 18M in the middle of the top surface thereof because the narrow space S1 may not have been filled completely by the conformal, blanket, hard mask, spacer layer 18C. In summary, in FIG. 1E, the single super-wide spacer 18W fills the narrow space S1 between the dummy layer patterning feature DA and the dummy layer patterning feature DB with four narrow, hard mask, sidewall spacers 18N formed on the sidewalls of the dummy features DA, DB, and DC aside from the narrow space S1. The wide gap WG is extended by a relatively wide opening S in place of space S2 which has been narrowed by spacers 31N and 32N between the dummy features DB and DC. The opening S and the lateral openings P and U on the right and left reach down to expose portions of the top surface of the cap layer 14 aside from the narrow spacers 18N. In summary, on the left, there is the lateral opening P followed by spacer 30N on the sidewall of dummy feature DA. On the right of the dummy feature DA is the super-wide spacer 18W which is followed by dummy feature DA, spacer 31N and an opening S. To the right of wide opening S is spacer 32N followed by dummy feature DC, spacer 33N and an opening U.

Figure 6:
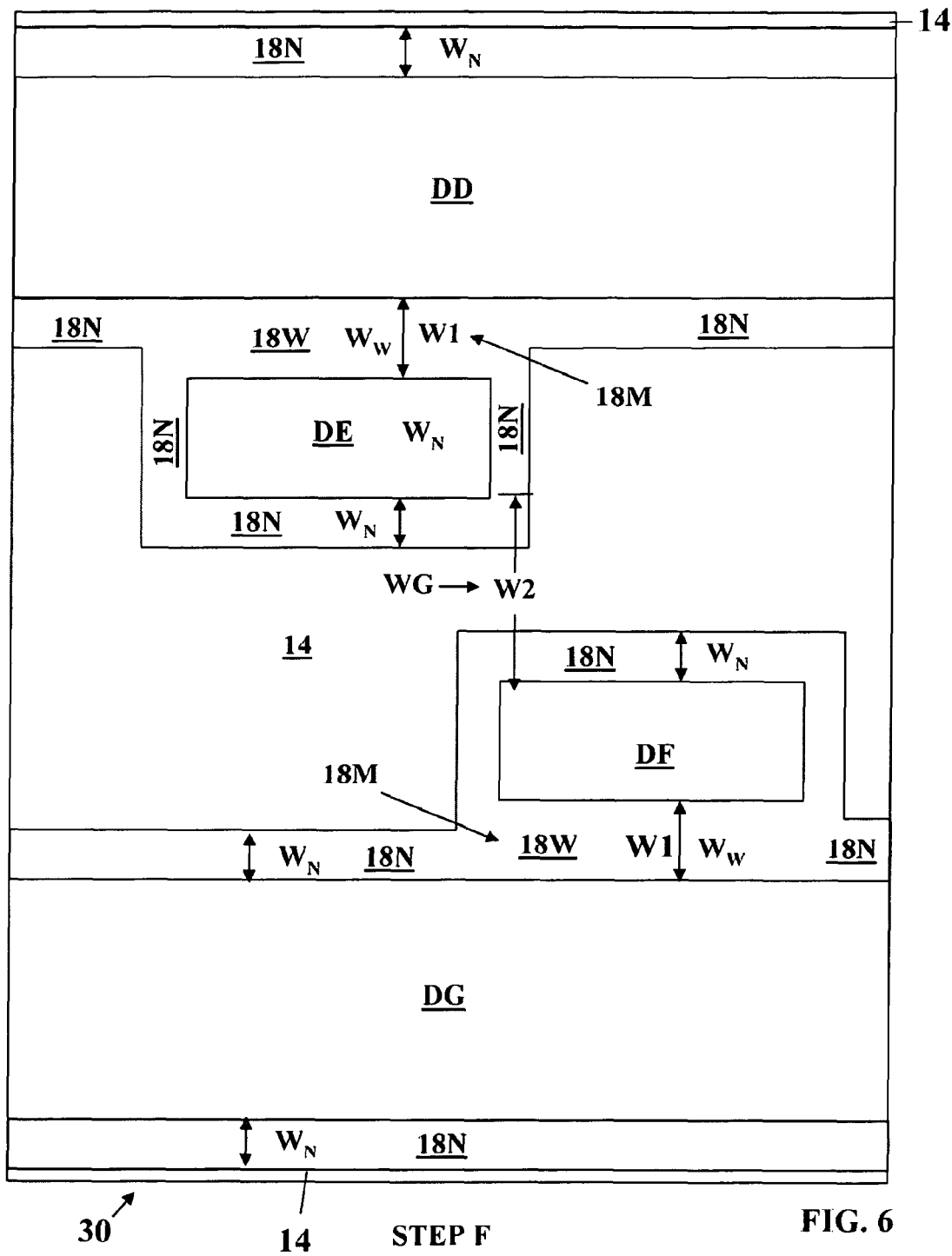

FIG. 6 is a plan view of the device 30 of FIG. 5, after the photoresist patterns PR1, PR2, PR3, and PR4 were stripped thereby exposing the dummy features DD, DE, DF, and DG which are shown bordered by a set of narrow, hard mask sidewall spacers 18N (similar to spacers 30N, 31N, 32N and 33N) except for areas defined by narrow spaces S1 where the adjacent sidewalls are bordered by hard mask, super-wide spacers 18W. In particular, FIG. 6 shows the result of steps E and F with the narrow spacers 18N and two super-wide spacers 18W on the periphery of the dummy features DD, DE, DF, and DG of the device 30. Where the two super-wide spacers 18W are formed, the proximate dummy features are spaced by the width W1. That is to say that the space between dummy features DD and DE and the space between the dummy features DF and DG is the width W1. However, the closest width between dummy features DE and DF is the width W2 (where dummy features DE and DF are in proximity to each other), which is too great a distance for formation of a super-wide spacer 18W.

Step G

Figure 1G:
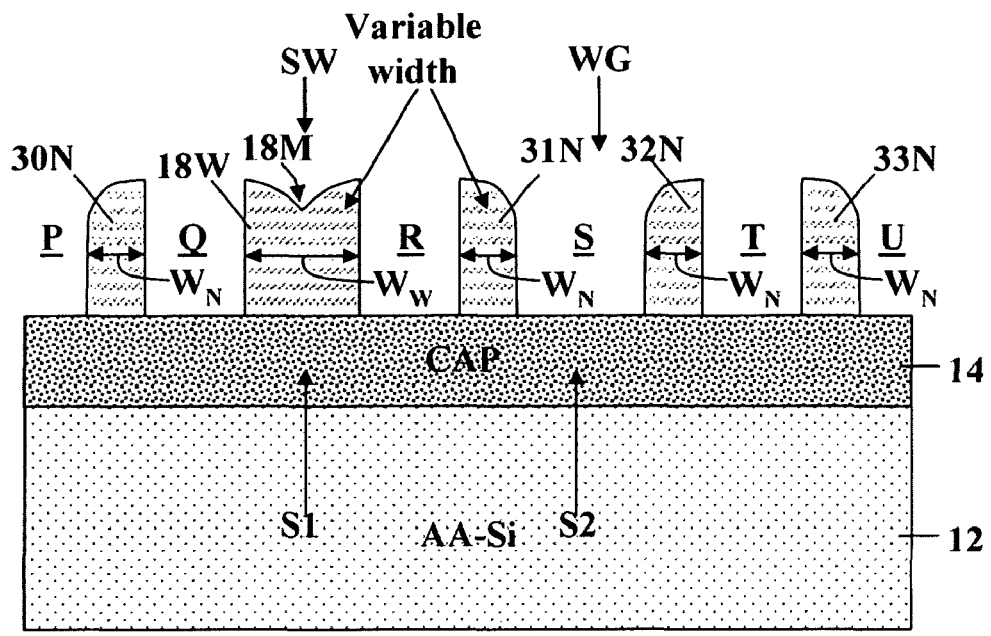

FIG. 1G shows the device 10 of FIG. 1F after stripping the dummy features DA, DB, and DC exposing the top surface of the cap layer 14 aside from the narrow sidewall spacers 30N, 31N, 32N and 33N and aside from the super-wide spacer 18W in accordance with step G of the invention as illustrated by the flowchart shown in FIG. 2. The device 10 is capped by the single super-wide spacer 18W and the four narrow (hard mask, sidewall) spacers 30N, 31N, 32N, and 33N spaced across the cap layer 14. To the left of the super-wide spacer 18W in place of dummy feature DA there is a new opening Q down to the surface of the cap layer 14, plus the single narrow spacer 30N to the left thereof followed by the space P. To the right of the super-wide spacer 18W is an opening R in place of dummy feature DB down to the surface of the cap layer 14, followed by a spacer 31N, the wide opening S, another spacer 32N, opening T in place of dummy feature DC down to the surface of the cap layer 14 and the opening U.

The dummy features are preferably stripped by an aqueous nitric acid (HNO3) solution or a KOH solution.

Figure 7:
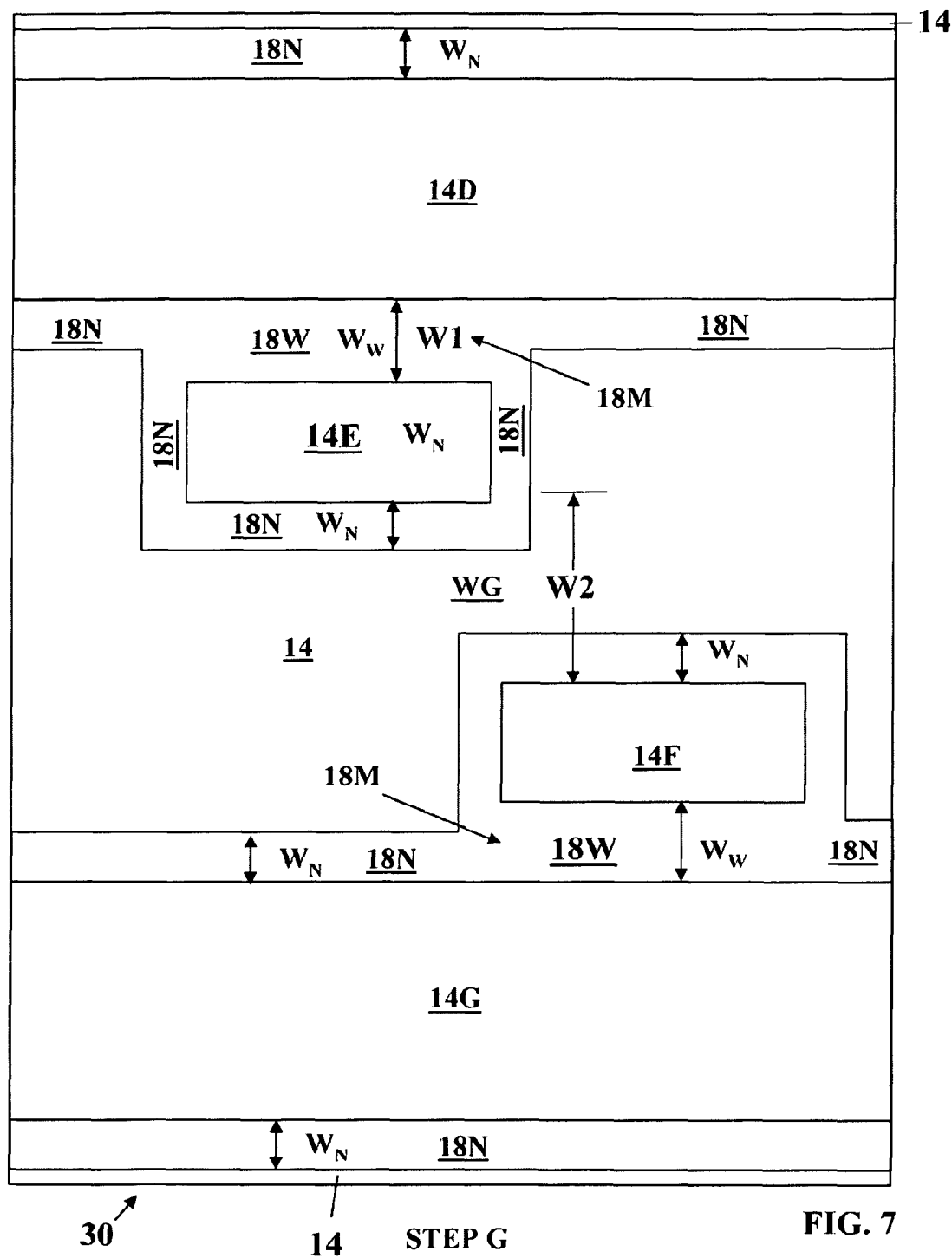

FIG. 7 a plan view of the device 30 of FIG. 6, which shows that after step G several areas of the top surface of cap layer 14 have been exposed. In particular the removal of the dummy features DD, DE, DF and DG, has exposed the top surface of cap layer 14 in respective cap areas 14D, 14E, 14F and 14G therebelow, bordered by the narrow sidewall spacers 18N and the super-wide spacers 18W.

Step H

Figure 1H:
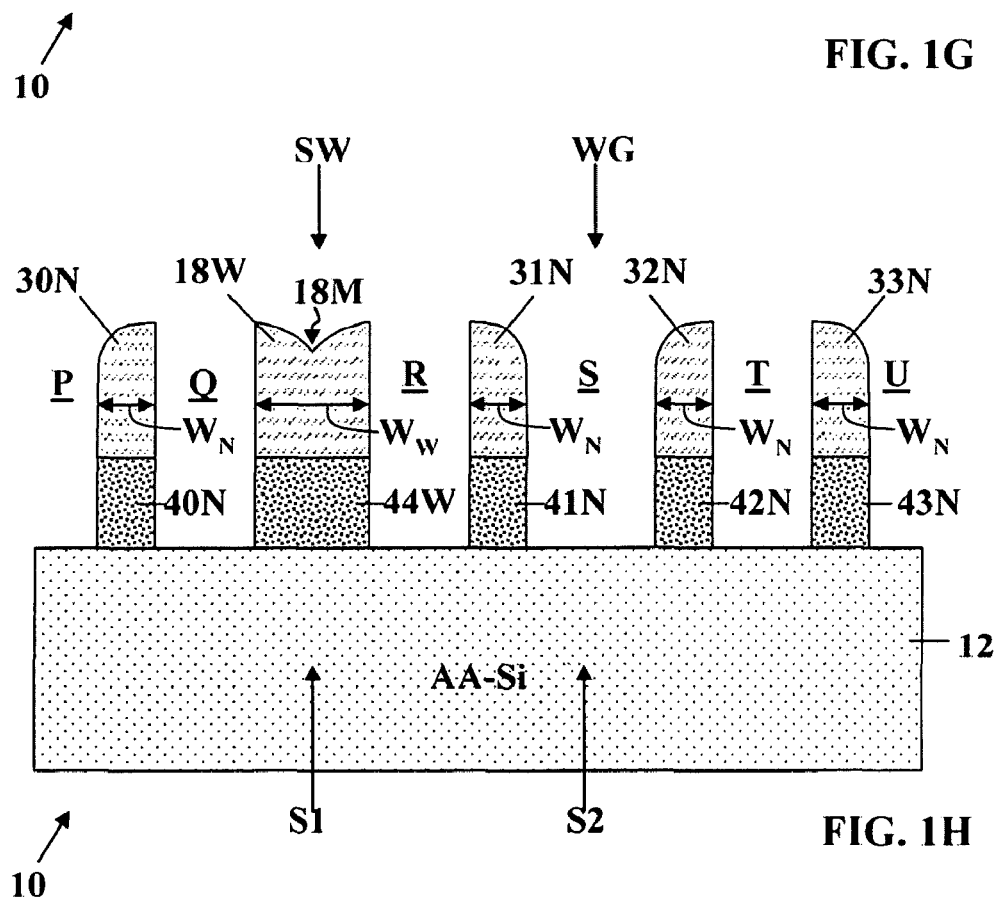

FIG. 1H shows the device 10 of FIG. 1G after etching the cap layer 14 anisotropically to form a cap mask in the pattern of the patterned hard mask. The cap mask is formed of narrow elements 40N, 41N, 42N, and 43N below the narrow sidewall spacers 30N, 31N, 32N, and 33N and a wide cap mask element 44W below the wide sidewall spacer 18W in accordance with step H of the invention as illustrated by the flowchart shown in FIG. 2. Below the openings P, Q, R, S, T, and U, the top surface of the substrate 12 is exposed.

Preferably, the etching the cap layer 14 of silicon nitride is performed by Reactive Ion Etching (RIE) in a chamber containing gases such as $CHF_3$, $CH_2F_2$, or $CH_3F$ under the conditions of plasma.

Figure 8:
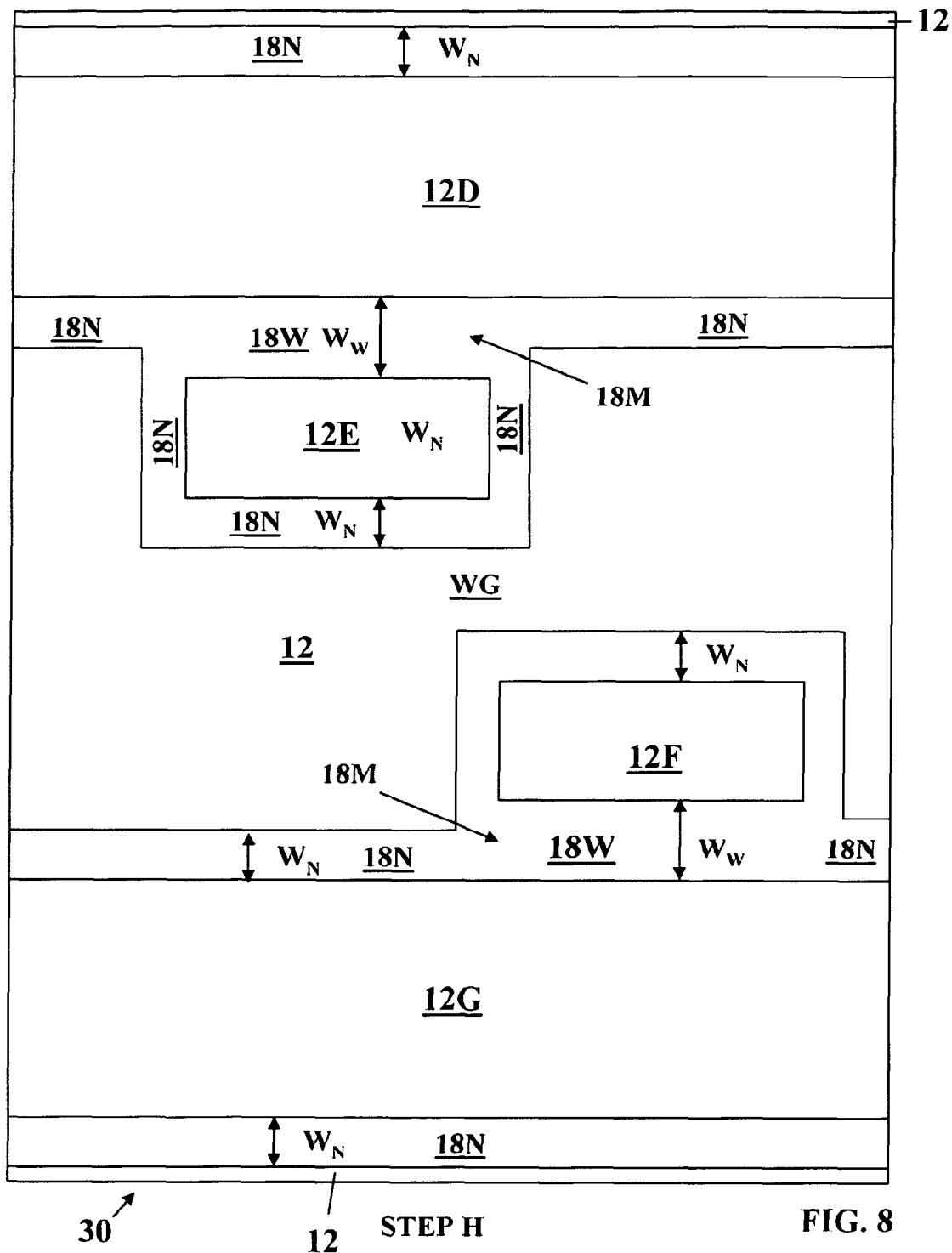

FIG. 8 is a plan view of the device 30 of FIG. 7, which shows the result of step H. The removal of the cap areas 14D, 14E, 14F, and 14G, has exposed the top surface of respective substrate areas 12D, 12E, 12F, and 12G therebelow, bordered by the narrow sidewall spacers 18N and the super-wide spacers 18W.

Figure 1I:
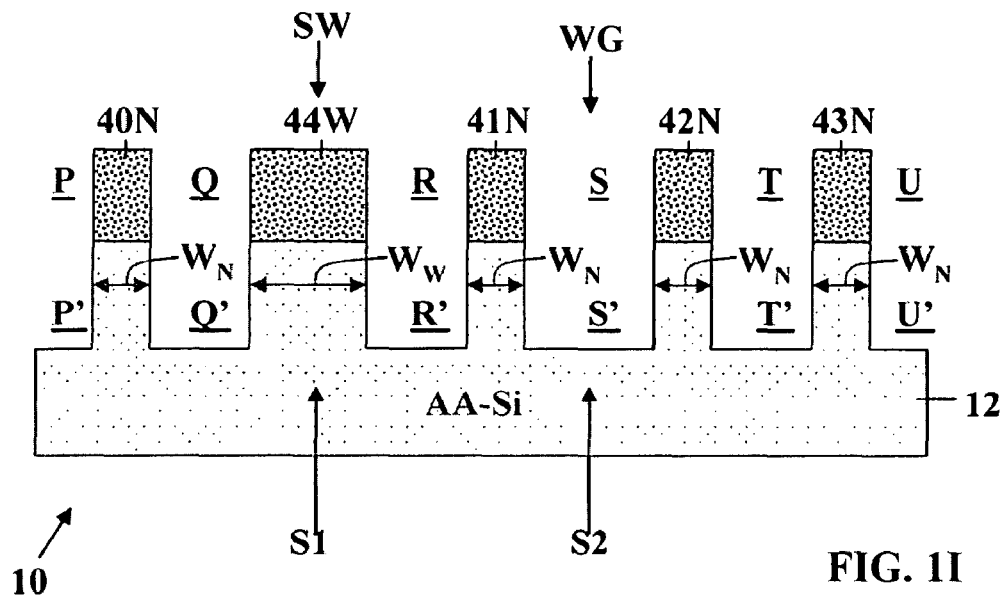

FIG. 1I shows the device 10 of FIG. 1H after stripping the hard mask spacers 18N and 18W exposing the top surface of the substrate 12 followed by etching the substrate in the pattern of the cap mask narrow elements 40N, 41N, 42N and 43N and the cap mask wide element 44W thereby extending openings P, Q, R, S, T, and U down into the substrate 12 to form Shallow Trench Isolation (STI) trenches P', Q', R', S', T', and U' in accordance with step I of the invention as illustrated by the flowchart shown in FIG. 2.

Preferably, the etching of the silicon of the substrate 12 is performed by Reactive Ion Etching (RIE) in a chamber containing chlorine under the conditions of plasma.

Figure 9:
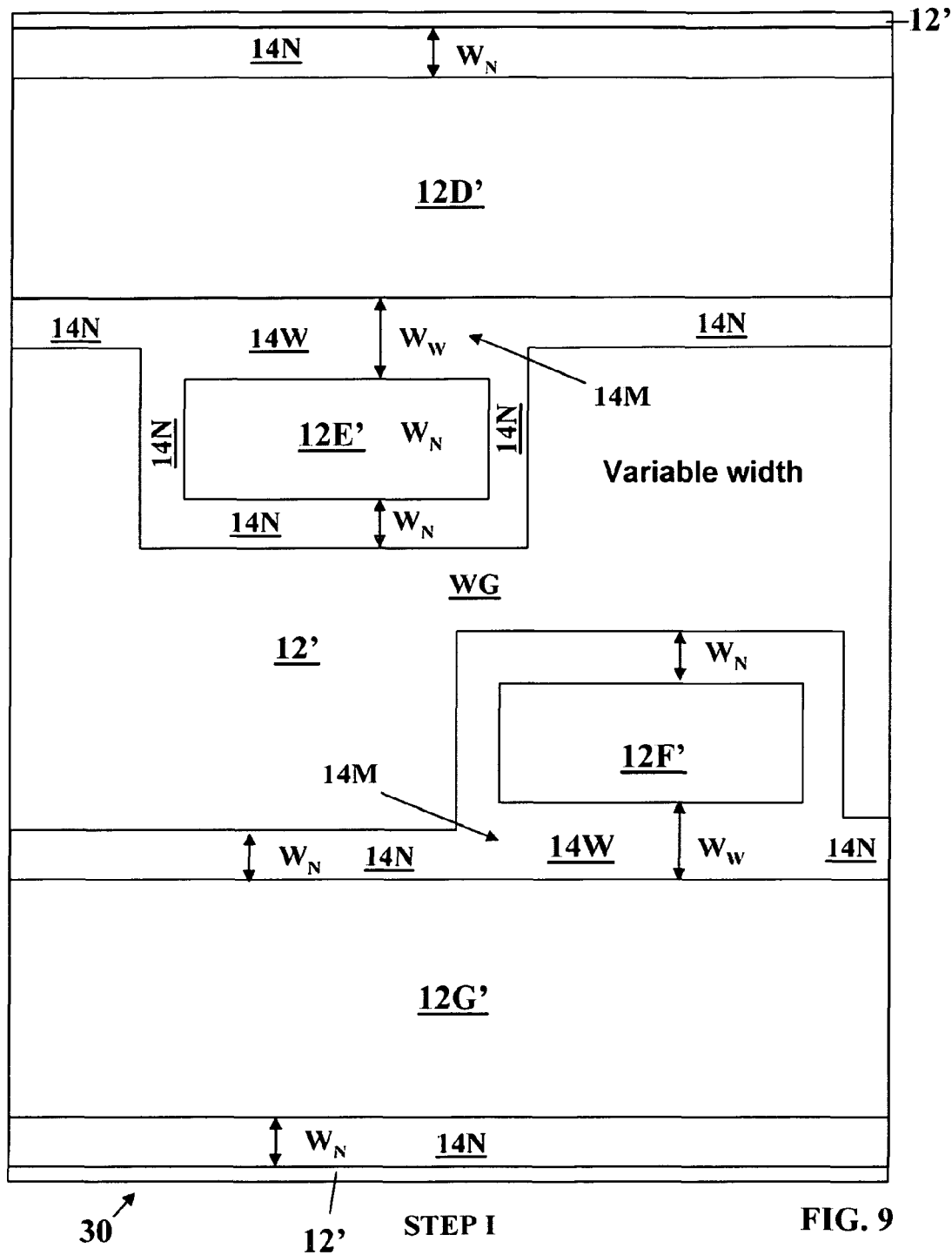

FIG. 9 shows the device 30 of FIG. 8 after step I of stripping the hard mask spacers 18N and 18W exposing the narrow cap layer mask elements 14N and the wide cap layer mask elements 14W followed by etching down into the substrate aside from the elements 14N/14W with trenches 12', 12D', 12E' 12F', and 12G' being formed in the substrate 12.

Figure 1J:
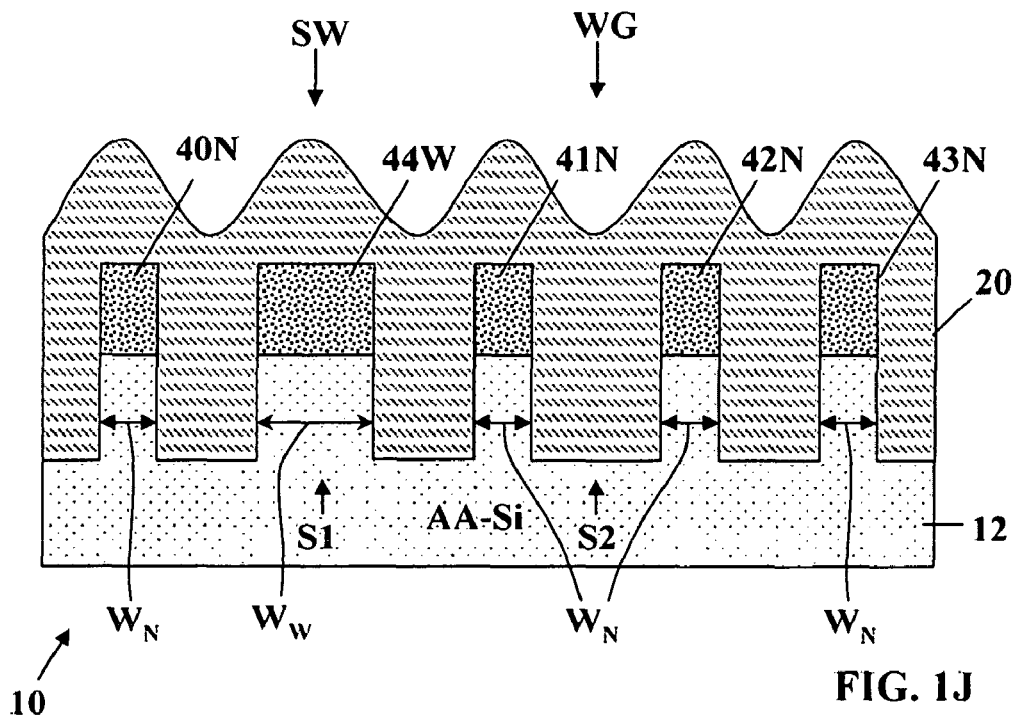

FIG. 1J shows the device 10 of FIG. 1I after depositing a blanket, Shallow Trench Isolation (STI) layer 20 overfilling the trenches P', Q', R', S', T' and U' composed of silicon dioxide or the like dielectric material. In addition as an option, the STI layer 20 can overfill the openings P, Q, R, S, T, and U in accordance with step J of the invention as illustrated by the flowchart shown in FIG. 2.

A HDP (High Density Plasma) oxidation process may be employed to form the STI layer. Preferably, the HDP process is performed in a chamber.

Figure 1K:
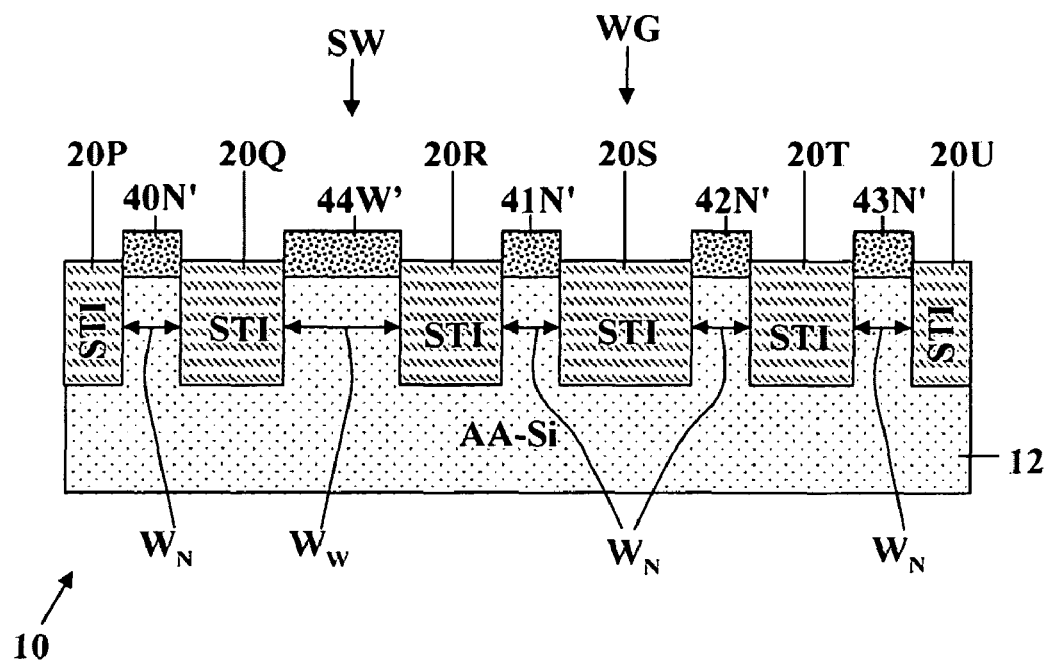

FIG. 1K shows the device 10 of FIG. 1J in accordance with step K of the invention as illustrated by the flowchart shown in FIG. 2. The etching back may be performed by Chemical Mechanical Planarization (CMP) or the like. The result is that planarized STI regions 20P, 20Q, 20R, 20S, 20T, and 20U have been formed in the trenches P', Q', R', S', T', and U' with a super-wide channel region having a width $W_W$ formed below the cap mask wide element 44W' in the super-wide spacer region SW between the flanking STI regions 20Q and 20R.

Figure 10:
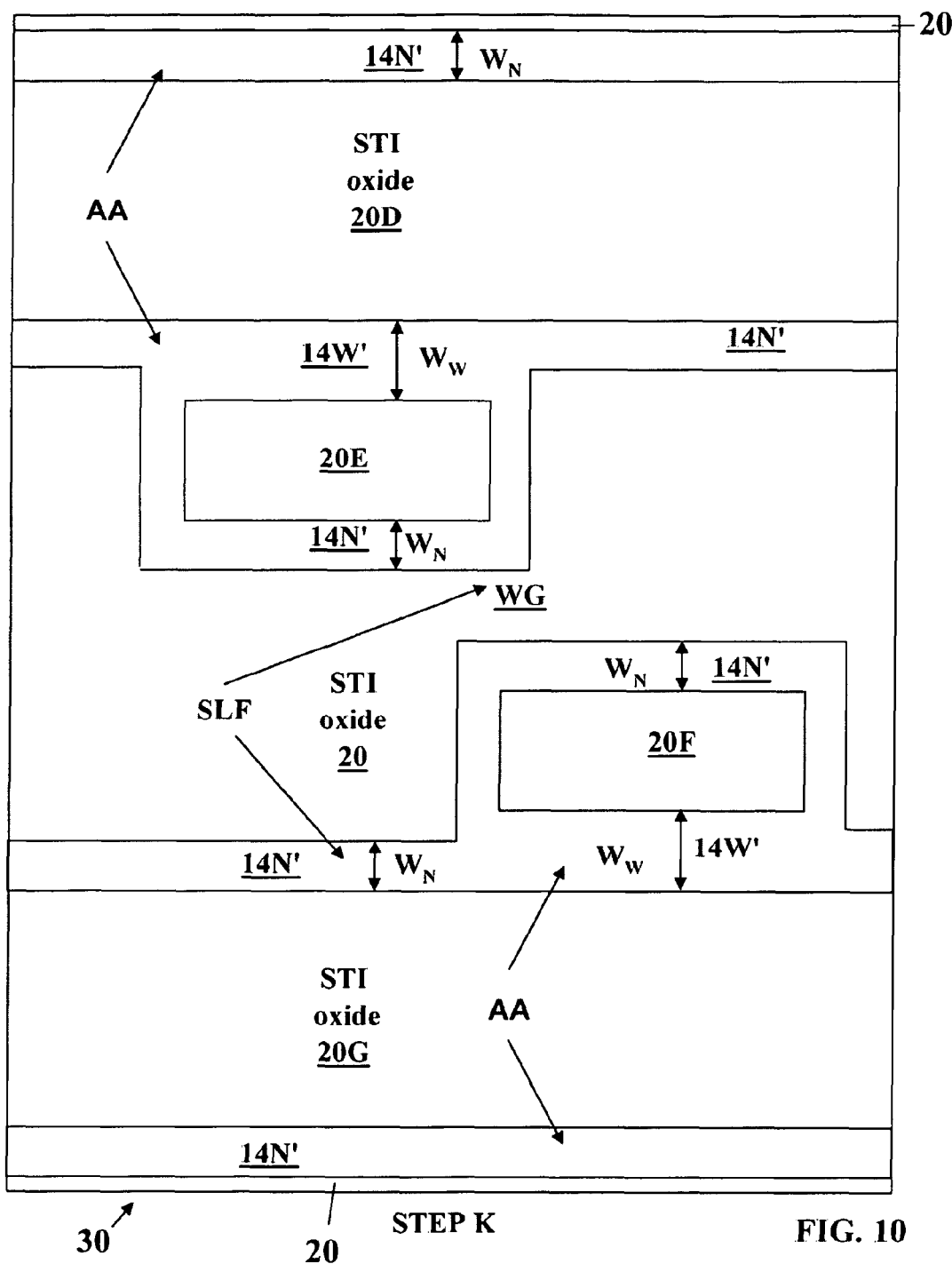

FIG. 10 shows the device 30 of FIG. 9 after step J of FIG. 2 with trenches 12', 12D', 12E' 12F', and 12G' in the substrate 12 filled with STI dielectric 20D, 20E, 20F, 20G and 20 and then planarized in step K of FIG. 2. The narrow cap layer mask elements 14N and the wide cap layer mask elements 14W are shown as having been etched to form lower narrow cap layer mask elements 14N' and the wide cap layer mask elements 14W'.

Figure 1L:
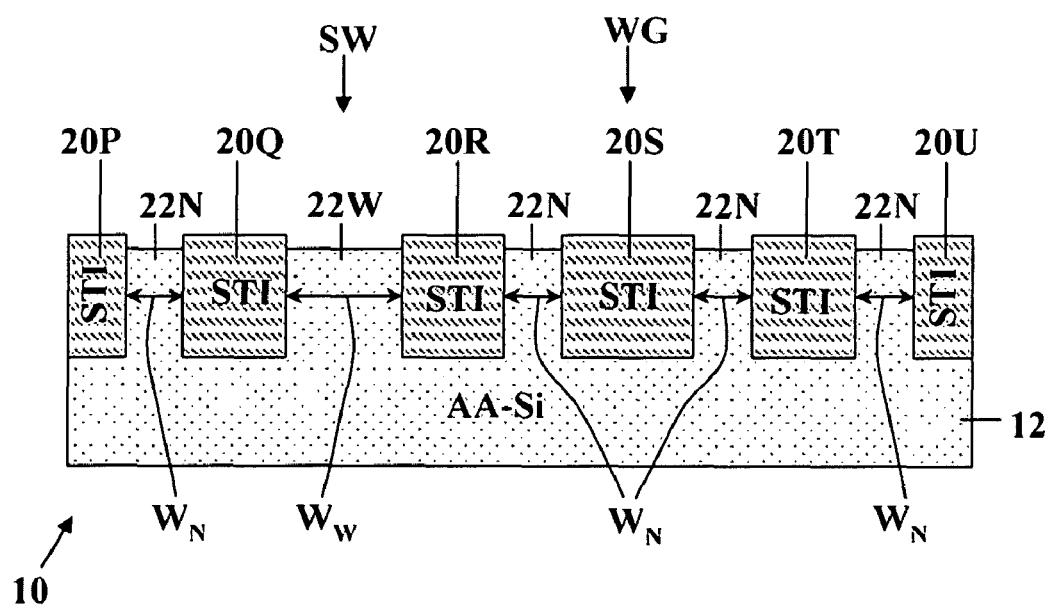

FIG. 1L shows the device 10 of FIG. 1K after stripping away the cap mask features leaving the active areas 22W and 22N exposed between the STI regions 20P, 20Q, 20R, 20S, 20T, and 20U according to step L of the invention according to the flowchart shown in FIG. 2. The super-wide channel region 22W for a pull down transistor of and SRAM device lies between the flanking STI regions 20Q and 20R.

Figure 11:
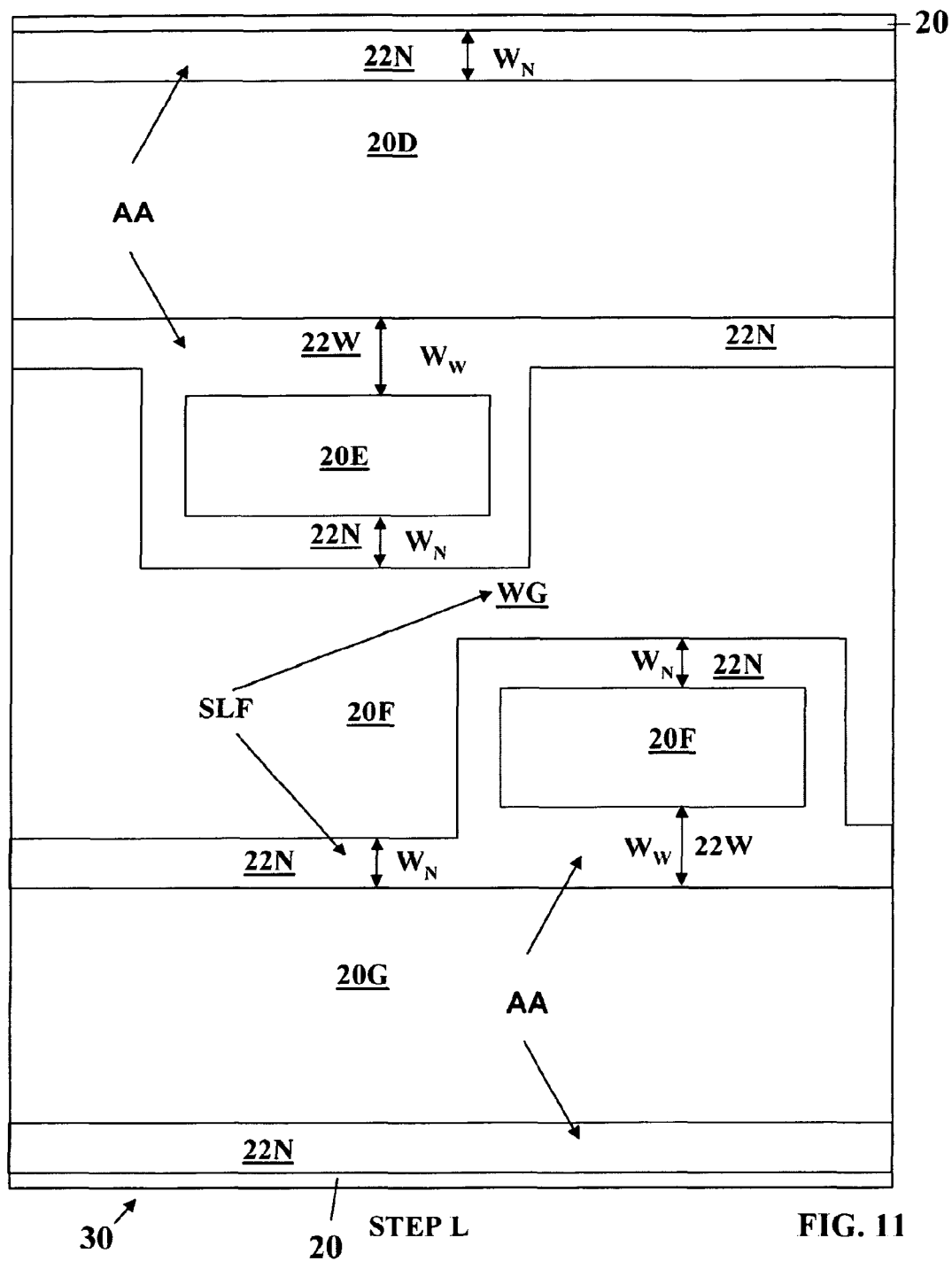

FIG. 11 shows the device 30 of FIG. 10 after step L of FIG. 2 in which the lowered cap mask elements 14N' and 14W' have been stripped from the device 30 exposing the narrow active areas 22N and the super-wide active areas 22W for the pull down transistors PD1/PD2 in the substrate 12.

Figure 12:
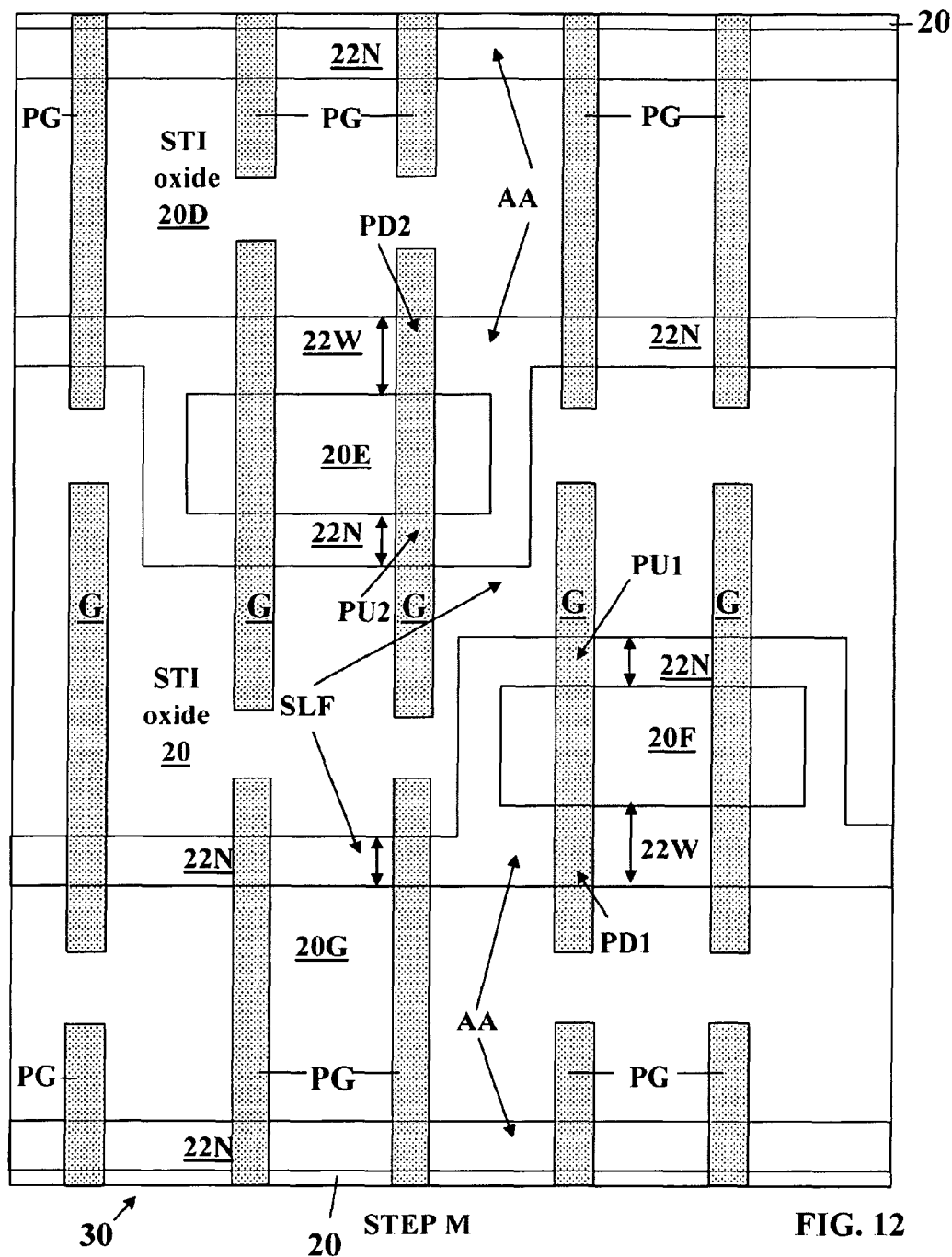

FIG. 12 shows the device 30 of FIG. 11 after step M of FIG. 2 in which gate electrode lines PD for pull down devices and gate electrode lines G for pass gate and pull up FET device features (not shown) have been formed over the device 30. The locations of the pull down devices PD1/PD2 and the pull up devices PU1/PU2 are indicated for a Static Random Access Memory device indicated by the phantom line marked SRAM.

Figure 13:
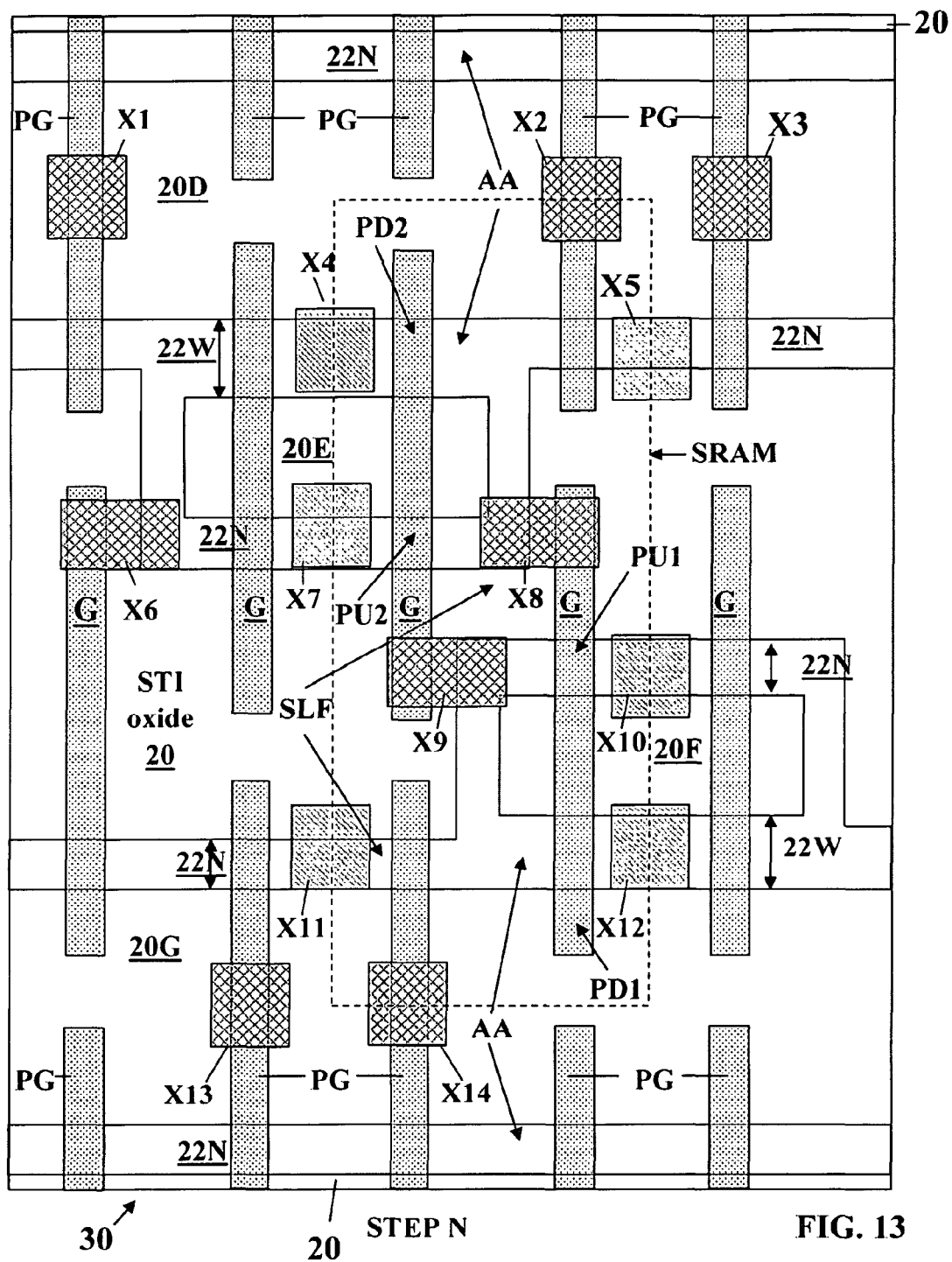

FIG. 13 shows the device 30 of FIG. 11 after step N of FIG. 2 in which contacts X1-X14 have been formed.

Figure 14:
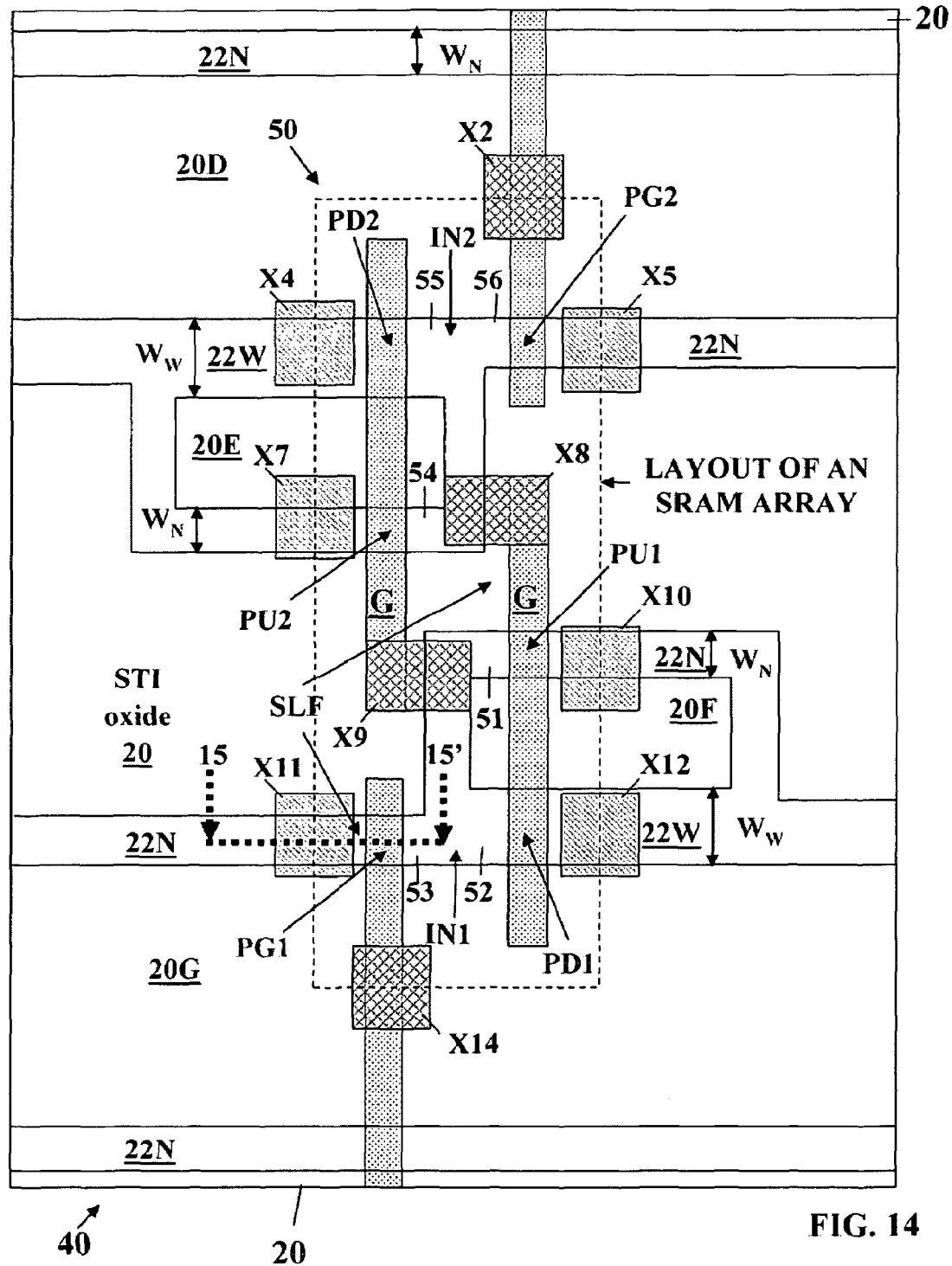
FIG. 14 shows a modification of the device of FIG. 13 with the layout of a complete SRAM cell which includes six FET transistors located within a phantom line, with the structure of the SRAM cell emphasized by eliminating gate lines which are not part of the cell.
Figure 15:
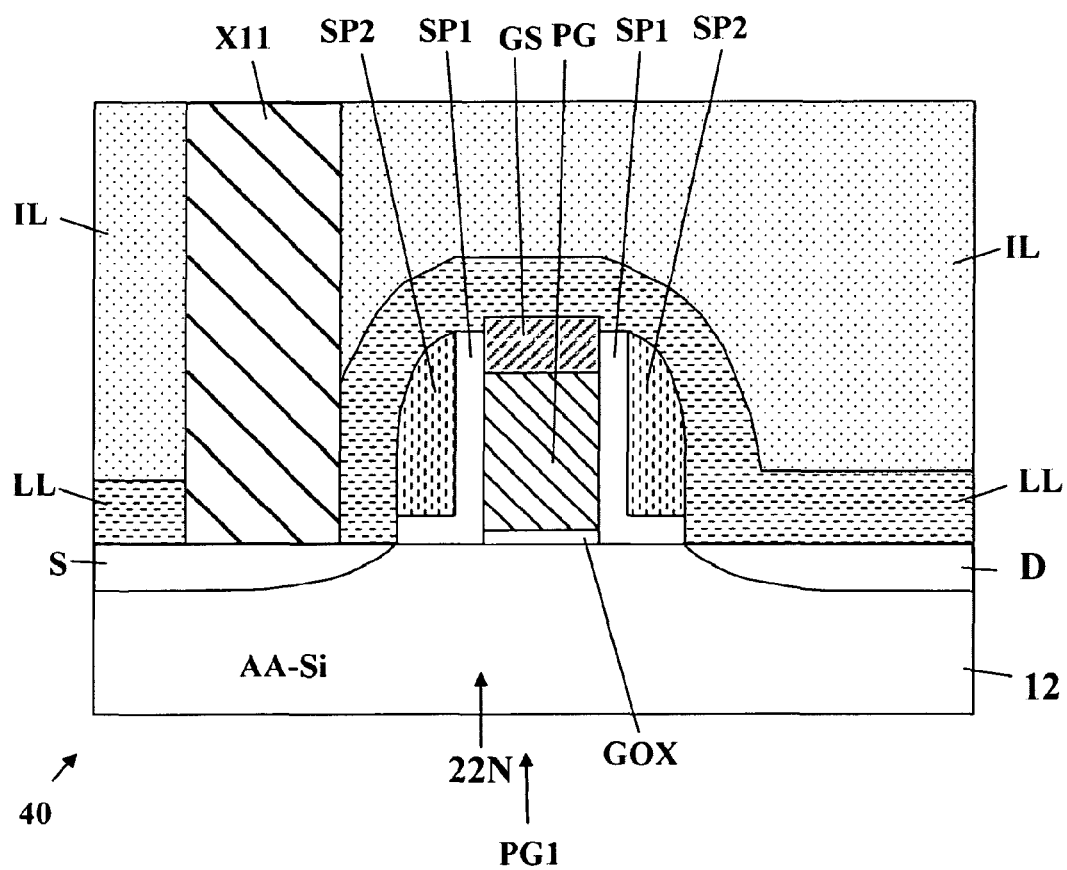
FIG. 15 shows a section taken along line 15-15' in FIG. 14.
Figure 16:
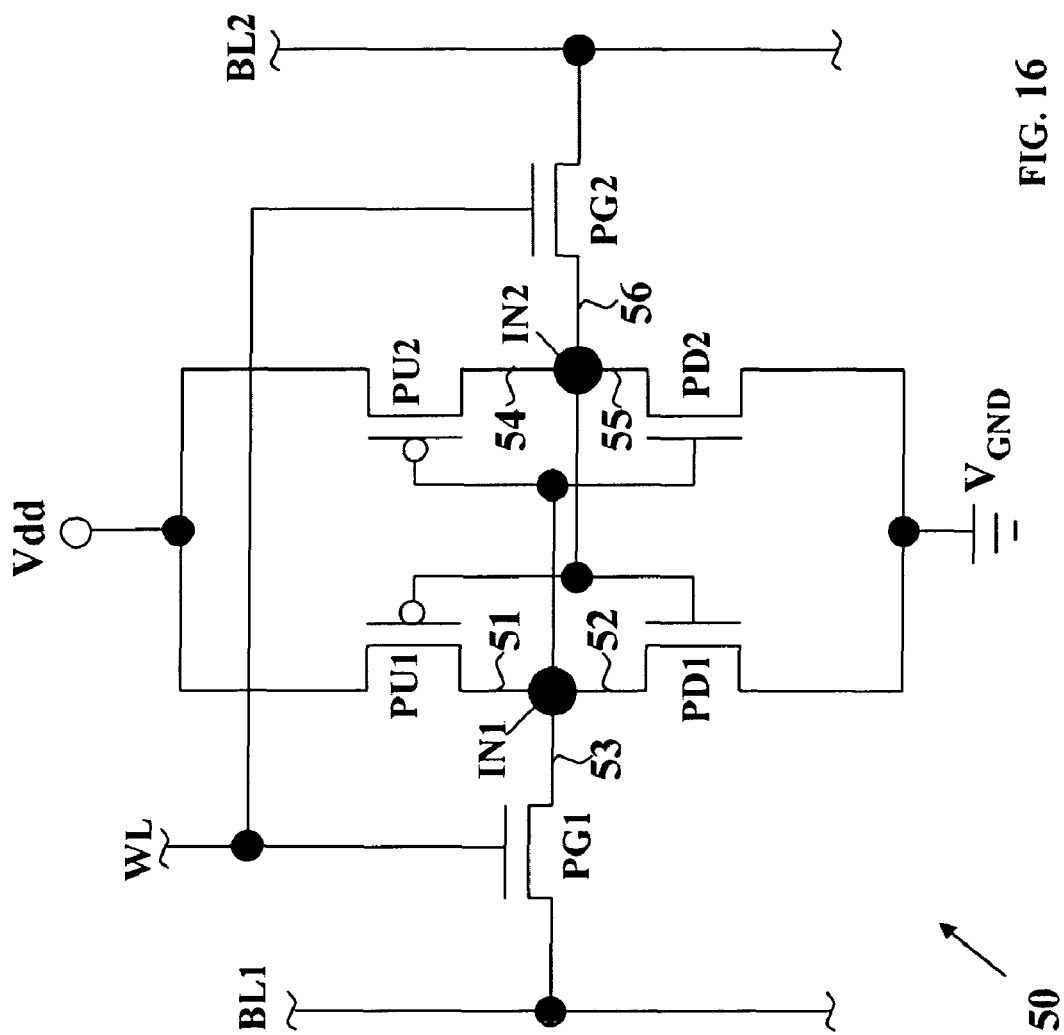
FIG. 16 is a schematic circuit diagram of the SRAM device shown in FIG. 14.

FIG. 14 shows a device 40 which is modification of the device 30 of FIG. 13 with the layout of a complete SRAM cell 50 which includes six FET transistors including a first pass gate PG1, a second pass gate PG2, a first pull up gate PU1, a second pull up gate PU2, a first pull down gate PD1, and a second pull down gate PD2 located within a phantom line, with the structure of the SRAM cell emphasized by eliminating gate lines which are not part of the cell. FIG. 15 shows a section taken along line 15-15' in FIG. 14. FIG. 16 is a schematic circuit diagram of the SRAM device shown in FIG. 14.

FIG. 14 shows the device 40 which is a modification of the device 30 of FIG. 13 with the layout of an SRAM device emphasized by eliminating gate lines which are not connected thereto. A section line 15-15' is shown extending through the first pass gate transistor PG1. The layout of an SRAM circuit 50 is shown within the phantom line in the center of the drawing. FIG. 16 shows the circuit diagram of the SRAM circuit 50 of FIG. 14. Referring to FIGS. 14 and 16, one internal node IN1 interconnects the drains of the first pass gate transistor PG1 by active area 53, the first pull up transistor PU1 by active area 51, and the first pull down transistor PD1 by active area 52. Another internal node IN2 interconnects the drains of the second pass gate transistor PG2 by active area 56, the second pull up transistor PU2 by active area 54, and the second pull down transistor PD2 by active area 55. The sources of the first pull up transistor PU1 and the second pull up transistor PU2 are connected to voltage Vdd. The sources of the pull down transistor PU1 and the pull down transistor PU2 are connected to ground voltage $V_{GND}$. The gates of the first and pull up transistor PU1 and the second pull down transistor PD2 are interconnected and the gates of the second pull up transistor PU2 and the first pull down transistor PD1 are interconnected. The gates of the first pass gate transistor PG1 and the second pass gate transistor PG2 are connected respectively to word lines WL1 and WL2. The sources of the first and second pass gate transistors PG1 and PG2 are connected respectively to bit lines BL1 and BL2.

Transistors PG1, PU1 and PD1

The first pass gate transistor PG1 is formed on narrow channel 22N on the lower left of the drawing, above a contact X14 and to the right of contact X11 with its drain connected to the internal node IN1 formed at the intersection of two narrow active areas 22N and the lower right wide active area 22W. The first pull up transistor PU1 is formed on a narrow active area 22N on the right side of the drawing, between contact X9 on the left and contact X10 on the right with its drain also connected to the internal node IN1. The first pull down transistor PD1 is formed on a wide active area 22W on the lower right side of the drawing to the left of contact X12 with its drain also connected to the internal node IN1.

Transistors PG2, PU2 and PD2

The second pass gate transistor PG2 overlies a narrow active area 22N on the upper right of the drawing, below a contact X2 and to the left of contact X5 with its drain connected to the internal node N2 formed at the intersection of two narrow active areas 22N and the upper left wide active area 22W. The second pull up transistor PU2 is formed on a narrow active area 22N on the left side of the drawing, between contact X7 on the left and contact X8 on the right with its drain also connected to the internal node IN1. The second pull down transistor PD2 is formed on a wide active area 22W on the upper left side of the drawing to the right of contact X4 with its drain also connected to the internal node IN1.

FIG. 15 is an elevational section taken along line 15-15' in FIG. 14 showing the first pass gate transistor PG1 formed on a silicon semiconductor substrate 12 with a sublithographic narrow channel 22N formed in accordance with this invention. A gate electrode stack is composed of a gate oxide layer GOX formed on the top surface of the substrate 12, and a doped polysilicon gate conductor PG, capped with a conductive gate silicide layer GS. Sidewalls of the gate electrode stack are protected by a first set of conformal L-shaped dielectric spacers SP1. A secondary set of tapered dielectric spacers SP2 are formed on the sidewalls of the dielectric spacers SP1. Source/drain regions S/D preferably composed of a doped silicide are formed in the substrate self-aligned with the secondary spacers SP1/SP2 aside therefrom. A conformal liner layer LL composed of silicon nitride is formed covering the device including both the gate electrode stack and the source/drain regions S/D. A blanket Inter-Layer Dielectric (ILD) layer IL covers the device. The contact X11 is shown reaching down through the liner layer LL and the ILD layer IL into contact with the source region S to the left of the gate electrode stack, which as stated above comprises the gate oxide layer GOX, the doped polysilicon gate conductor PG, and the cap formed by the conductive gate silicide layer GS.

Referring again to FIG. 14 the SRAM device 40, with pull up transistors PU1/PU2 and pass transistors PG1/PG2, has channels 22 that are sublithographic. Whereas the channels 22W of the pull down transistors PD1/PD2 may also be sublithographic, channels 22W are wider than the channels 22 of the pass transistors PG1/PG2. In other words, the SRAM device 40 includes pull up transistors PU1/PU2, pull down transistors PD1/PD2 and pass transistors PG1/PG2 where pull up transistors PU1/PU2 and pass transistor have sublithographic channel width, and the drains of the pull up transistors PU1/PU2 are connected with SRAM internal nodes IN1/IN2 respectively by the sublithographic active regions 22.

In addition, in FIG. 14, the semiconductor device 40 contains features with different widths including narrow sublithographic features 22 and wider features 22W, where the narrow feature 22 are self-aligned to the wider features 22W without any lithographic overlay error.

While this invention has been described in terms of the above specific embodiment(s), those skilled in the art will recognize that the invention can be practiced with modifications within the spirit and scope of the appended claims, i.e. changes can be made in form and detail, without departing from the spirit and scope of the invention. Accordingly all such changes come within the purview of the present invention and the invention encompasses the subject matter of the following claims.

Having thus described the invention, what is claimed as new and desirable to be secured by Letters Patent is as follows:

1. An SRAM device with pull up, pull down, and pass transistors wherein
    said pull up transistors and said pass transistors have channels with sublithographic channel widths: and
    drains of said pull up transistors are connected with SRAM internal nodes by sublithographic active regions.

2. The device of claim 1 wherein said pull up transistors have channels with sublithographic channel widths interconnected with wider active areas for said pull down transistors.

3. The device of claim 1 wherein said pull down transistors have wider channel widths than said pull up transistors and said pass transistors.

4. A semiconductor device comprising pull up, pull down, and pass transistors having sublithographic features of different widths, wherein a narrow feature is self-aligned to a wide feature without any lithographic overlay error, wherein
    channels of said pull up transistors and said pass transistors have sublithographic widths, and
    drains of said pull up transistors are connected to SRAM internal nodes by sublithographic active regions.

5. The device of claim 4 wherein said device includes an SRAM device with pull up and pass transistors having channels with sublithographic channel widths interconnecting with wider active areas for said pass transistors.

6. The device of claim 5 wherein said pull down transistors have wider channel widths than said pull up transistors and said pass transistors.

7. The device of claim 5 wherein said pull up transistors have channels with sublithographic channel widths interconnected with wider active areas for said pull down transistors.

8. The device of claim 4 wherein:
    said pass transistor is provided with a sublithographic narrow channel, and is formed on a silicon substrate;
    a gate electrode stack comprises a gate dielectric layer and a polysilicon conductor formed on top of said substrate;
    a first set of conformal L-shaped dielectric spacers formed on sidewalls of said gate electrode stack; and
    a set of secondary dielectric spacers formed on sidewalls of said L-shaped dielectric spacers.

9. The device of claim 8 wherein:
    said polysilicon conductor is capped with a conductive silicided layer; and
    source and drain (S/D) regions include a doped silicide formed on said substrate self-aligned with said secondary spacers.

10. The device of claim 8 wherein a conformal silicon nitride liner covers said gate electrode stack and said S/D regions.

* * * * *